United States Patent
Suzuki et al.

(10) Patent No.: US 6,417,682 B1
(45) Date of Patent: Jul. 9, 2002

(54) SEMICONDUCTOR DEVICE TESTING APPARATUS AND ITS CALIBRATION METHOD

(75) Inventors: Toshikazu Suzuki; Hiroyuki Nagai; Noriyoshi Kozuka; Yukio Ishigaki; Shigeru Matsumura; Takashi Sekizuka; Hiroyuki Shiotsuka; Hiroyuki Hama; Eiichi Sekine, all of Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/314,887

(22) Filed: May 19, 1999

(30) Foreign Application Priority Data

| May 19, 1998 | (JP) | 10-137082 |
| Jun. 22, 1998 | (JP) | 10-174218 |
| Oct. 29, 1998 | (JP) | 10-308430 |

(51) Int. Cl.[7] ............................................. G01R 31/02
(52) U.S. Cl. ..................... 324/755; 324/600; 324/537; 324/158.1
(58) Field of Search .................. 324/755, 601, 324/600, 130, 537, 76.74, 617, 158.1; 702/89

(56) References Cited

U.S. PATENT DOCUMENTS 5,703,489 A * 12/1997 Kuroe .......................... 324/601
5,884,236 A * 3/1999 Ito ................................. 702/89
6,131,074 A * 10/2000 Kawai .......................... 702/107

FOREIGN PATENT DOCUMENTS

| DE | 19636916 | 3/1997 |
| DE | 19541244 | 5/1997 |

* cited by examiner

*Primary Examiner*—N. Le
*Assistant Examiner*—T. R. Sundaram
(74) *Attorney, Agent, or Firm*—Rosenthal & Osha L.L.P.

(57) ABSTRACT

A calibration method for calibrating a semiconductor testing apparatus before mounting semiconductor devices for performing a testing of electric characteristics thereof, the testing apparatus having a driver which generates and outputs a signal, and a socket with a plurality of terminals for receiving pins and transferring signals therethrough. The calibration method includes mounting a test board having a plurality of pins onto the socket and connecting each of the pins of the test board with a respective terminal of the socket, transferring the signal of the driver to the terminals of the test board, detecting the signal of the driver that has reached the test board, and setting an output timing of the signal of the driver based on the signal detected.

42 Claims, 26 Drawing Sheets

SEMICONDUCTOR DEVICE TESTING APPARATUS AND ITS CALIBRATION METHOD

This patent application claims priority based on Japanese patent applications, H10-308430 filed on Oct. 29, 1998, H10-137082 filed on May 19, 1998, and H10-174218 filed on Jun. 22, 1998, the contents of which are incorporated herein by reference.

BACKGROUND OF THE INVENTION

1. Field of the Invention

The present invention relates to a semiconductor device testing apparatus for testing a semiconductor device (also called "DUT". For example, semiconductor integrated circuit or the like), and more particularly to a calibration jig of the semiconductor device testing apparatus and a method for calibrating the semiconductor device testing apparatus.

2. Description of Related Art

FIG. 1 is a cross sectional view of a conventional semiconductor testing apparatus. The test head 70 outputs a test signal for testing the semiconductor device 20 and receives an output signal output from the semiconductor device 20. A performance board 66, which transmits signals to the test head 70 through the coaxial cables 62 and 64, is installed on the test head 70. The coaxial cable 62 transmits the test signal from the performance board 66 to the socket board 60. The coaxial cable 62 also transmits the output signal from the socket board 60 to the performance board 66. A socket 50 is installed on the socket board 60. The test signal is supplied to the semiconductor device 20 through the pin 52 and the first terminal 12 of the socket 50. The output signal is received from the semiconductor device 20 via the second terminal 14 and the pin 54.

The test head 70 has a driver 76 (76A and 76B) for generating test signals, drive delay circuits 78 (78A and 78B) for delaying the test signals generated by the drivers 76, comparators 80 (80A and 80B) for receiving the output signal, and comparator delay circuits 82 (82A and.82B) for delaying the time at which the comparators 80 output the output signal after the comparators 80 have received the output signal. The test signal output from each of the drivers 76 is measured using a measuring apparatus such as an oscilloscope. The delay times given by the driver delay circuits 78 are adjusted so that the output timings at which the test signals are output from the drivers will be equal to each other. Thus, the skews between the drivers 76 can be canceled by each other. Moreover, by adjusting the delay times given by the comparator delay circuits 82, the skews between the comparators 80 can be canceled by each other.

FIG. 2(a) is a top view of the semiconductor device 20. FIG. 2(b) is a front view of the semiconductor device 20. The semiconductor device 20 shown here is of TSOP type. However, the semiconductor device 20 may be of QFP or BGA type. Semiconductor devices of different types can be tested by preparing a socket 50 for each of the different semiconductor device types. The semiconductor device 20 has a semiconductor device input pin 22 for inputting a signal and a semiconductor device output pin 24 for outputting a signal. These pins contact the first terminal 12 and second terminal 14, respectively.

FIG. 3 is a cross sectional view of the socket 50 and the socket board 60 on which the socket 50 is mounted. When the socket 50 is installed on the socket board 60 along the socket guide 58 of the socket board 60, the pins 52 and 54 of the socket 50 are inserted into the corresponding through holes 56 of the socket board 60. Moreover, the core wires of the coaxial cables 62 and 64 are inserted into and soldered to the corresponding through holes 59 from the bottom side. In recent years, the number of pins used in the semiconductor device has increased. Hence, it is getting difficult to bring the probe of an oscilloscope or the like into contact with the first terminal 12 of the socket 50 accurately. A method for solving this problem is being proposed, in which the socket 50 is removed from the semiconductor device 20 and the probe is brought into direct contact with the socket board.

FIG. 4 is a top view of the socket board 60. Installed on the socket board 60 are through-holes 56 for inserting the pins 52 and 54 of the socket 50 and through-holes 59 for inserting and soldering the coaxial cables 62 and 64. Moreover, an earth pattern (GND) and a power source pattern (VDD) are installed on the top surface of the socket board 60. By bringing the probe of the oscilloscope into contact with the socket board 60, the semiconductor testing apparatus can be calibrated.

FIG. 5 shows a state in which the probe 44 is in contact with the socket board 60. The probe 44 has a signal terminal 40 and an earth terminal 42. The socket 50 is first removed from the socket board installed on the testing apparatus. The signal terminal 40 of the probe 44 is then brought into contact with the socket through-hole 56. The earth terminal 42 is then brought into contact with the earth pattern on the socket board 60. In this way, a signal supplied to the through-hole 56 is measured. However, when the earth pattern is not near the through-hole to be measured, the earth-line of the probe 44 connected to the earth terminal 42 must be made long. In this case, the line impedance during the measurement becomes large. In recent years, as the semiconductor device 20 becomes faster, the semiconductor device 20 needs to be tested with a higher degree of accuracy. Therefore, the semiconductor testing apparatus also needs to be calibrated with a higher degree of accuracy. However, when the line impedance is large when the test signal is measured, the semiconductor testing apparatus cannot be calibrated accurately.

The signal wire pattern and the earth pattern are installed adjacent to each other on the performance board 66. Hence, the line impedance of the signal can be reduced by removing the socket 50, the socket board 60, and the coaxial cables 62 and 64, and bringing the probe into direct contact with the performance board 66. However in this case, the influence of the inductance and floating capacitance of the socket 50, socket board 60, and coaxial cables 62 and 64 do not appear on the test signal. Therefore, the semiconductor testing apparatus cannot be calibrated accurately in the actual testing state.

FIG. 6 shows another conventional method for calibrating the semiconductor testing apparatus. In this embodiment, a comparator 80 and a programmable load 180 are installed parallel with the driver 76. By setting the programmable load 180 suitably, a load of desired level can be applied to the driver 76. The semiconductor device 20 is removed from the socket 50, and a test signal is output from the driver 76. The test signal then is reflected by the top end of the socket 50 and is input to the comparator 80. By dividing by 2 the time t1 required for the test signal to travel from the drive 76 to the comparator 80 via the top end of the socket 50, the signal transmission time from the drive 76 to the socket 50 can be measured.

FIG. 7 shows further another embodiment of the conventional semiconductor testing apparatus. As shown in FIG. 7, two coaxial cables are connected to each pin of the socket 50. In this case, even if a test signal is generated after removing the semiconductor device 20, the test signal is transmitted to the comparator 90 without being reflected by the socket 50. Hence, the test signal transmission time from the drive 76 to the socket 50 cannot be measured.

FIG. 8 is a flow chart showing a conventional calibration method. First, the probe 44 is brought into contact with the through-hole 56 of the socket board 60 and the earth pattern GND, which are the points of measurement (S302). Next, timing measurement and calibration are carried out (S310). That is, the timing at which the wave form of the test signal output from a 1-channel driver rises or falls is measured to obtain calibration data. Next, the setting value of the driver delay circuit 78 is set to the initial condition, and a test signal is generated under a prescribed amplitude condition (S312). Next, the timing of the rise of the wave form of the test signal is measured, and the driver 76 is calibrated along with the rising wave form (S314). Next, the timing of the falling wave form of the test signal is measured, and the driver 76 is calibrated along with the falling wave form (S316).

FIG. 9(a) shows the wave form of the test signal measured in the timing measuring S310. The wave form S0 is at 50% level at the reference timing position t0. The wave form S1 is at 50% level at the reference timing position t1. The wave form S2 is at 50% level at the reference timing position t2. The slew rate is represented by the slope of the rise or fall of the wave form. The multiple drivers 76 of the test head 70 are adjusted so that they will output signals with the slew rate of 500 pico seconds/V±(less than 10%). In the rising wave form measuring S314, as shown in FIG. 9(b), the delay amount of each of the driver delay circuits 78 that correspond to the multiple drivers 76 is adjusted to shift the timings t1 and t2 to t0. In this way, the multiple drivers 76 are calibrated. As a result of this shift, the setting data in which the delay amounts of the driver delay circuits 78 are increased or decreased is obtained as calibration data. When the resistance values of the signal terminal 40 of the probe 44 and the through hole 56 of the socket board 60 are high due to a dust or the like, the signal level of the test signal becomes lower than 50%. In such a case, it can be easily determined that a contact failure exists.

FIG. 9(c) shows the wave form of the test signal in the case in which a contact failure exists between the earth terminal 42 of the probe 44 and the earth pattern GND. The wave form $S_4$ is an exemplary wave form when the earth terminal 42 of the probe 44 and the earth pattern GND are open. The wave form $S_6$ is an exemplary wave form when there is a high contact resistance between the earth terminal 42 of the probe 44 and the earth pattern GND. The wave forms $S_4$ and $S_6$ are rounded and distorted. However, the 50% level is measured for both the wave forms $S_4$ and $S_6$ as in the case of the normal wave form $S_0$. In this case, when the calibration is carried out, the contact failure is overlooked. Since the calibration cannot be carried out at the proper timing position, there is a possibility that a wrong calibration is performed. For example, in the wave form $S_6$, there is a timing displacement $e_2$ with respect to the normal wave-form $S_0$. Moreover, also in the wave form $S_4$, there is a timing displacement $e_1$ with respect to the normal wave form $S_0$. Hence, the drivers 76 are calibrated at a wrong timing. When the calibration is carried out in the presence of a timing displacement, the calibration accuracy or the reliability of the calibration operation deteriorates.

As a method for checking a contact failure, the method of measuring the direct current resistance at the contact point between the robe 44 and the socket board 60 is known. This method can be used to detect a contact failure between the signal terminal 40 of the probe 44 and the through hole 56 of the socket board 60. However, a contact failure between the earth terminal 42 of the probe 44 and the earth pattern GND of the socket board 60 that is a ground side line is difficult to detect since the earth pattern GND is a circuit earth and is commonly connected.

It is an object of the present invention to provide a semiconductor testing apparatus capable of solving at least one of the above-stated problems. The object of the present invention can be achieved by a combination of characteristics described in the independent claims of the present invention. Moreover, the dependent claims of the present invention determine further advantageous embodiments of the present invention.

SUMMARY OF THE INVENTION

According to the first aspect of the present invention, A calibration method for calibrating an output timing of a test signal of a semiconductor testing apparatus is provided. The semiconductor testing apparatus has a socket on which a semiconductor device is mounted, the socket having a first terminal capable of supplying the test signal to be used to test the semiconductor device and a driver which outputs the test signal to the first terminal can be provided. This calibration method has mounting onto the socket a test board having a pin arrangement corresponding to a pin arrangement of the semiconductor device, generating the test signal using the driver, detecting the test signal that has reached the test board, setting an output timing of the test signal based on the test signal detected in the test signal detecting.

According to the other aspect of the present invention, a calibration method can be provided such that a pin of the test board that contacts the first terminal has an input impedance that is substantially equal to an input impedance of a pin of the semiconductor device that contacts the first terminal.

According to the still other aspect of the present invention, a calibration method can be provided such that a contact terminal of the test board that contacts the first terminal is connected to an earth pattern of the test board, and wherein the detecting includes measuring the test signal that has been output from the driver and reflected by the test board.

A calibration method can be provided such that the mounting includes examining a contact failure between the socket and the test board by measuring a direct current resistance between the socket and the test board.

A calibration method can be provided such that the semiconductor testing apparatus further has a comparator which receives the test signal from the test board. The mounting has measuring the test signal that has been output from the driver and reflected by the test board using the comparator, judging whether a wave form of the test signal measured by the comparator lies within a prescribed range or not, and reporting a contact failure on a transmission line between an output end of the driver and the test board when the wave form measured by the comparator lies outside the prescribed range.

A calibration method can be provided such that the semiconductor testing apparatus further has a delay circuit which supplies a delay to the test signal. The generating includes outputting the test signal using the driver and generating a prescribed reference signal. The setting has a delay setting for setting a size of the delay supplied to the test signal detected in the test signal detecting by the delay circuit based on a phase difference with respect to the reference signal.

A calibration method can be provided such that the test board has a signal wire pattern for contacting the first terminal and an earth pattern that is arranged adjacent to the signal wire pattern. The detecting includes detecting the test signal using an electric characteristic testing probe installed on the earth pattern and the signal wire pattern.

A calibration method can be provided such that the mounting includes examining a contact failure by measuring a direct current resistance between the electric characteristic testing probe and the test board.

A calibration method can be provided such that the mounting has checking a contact failure between the electric characteristic testing probe and the test board. The checking includes contacting the electric characteristic test probe with the test board, measuring in an external measuring apparatus the test signal detected by the electric characteristic test probe, judging whether a wave form of the test signal measured by the external measuring apparatus lies within a prescribed range, and reporting a contact failure between the electric characteristic test probe and the test board when the wave form measured by the external measuring apparatus lies outside the prescribed range.

A calibration method can be provided such that the socket further has a second terminal which contacts the semiconductor device and receives an electric signal from the semiconductor device. The semiconductor testing apparatus further has a comparator for receiving a signal input from the second terminal. The test board is a short board including a short pattern which electrically connects the first terminal with the second terminal.

A calibration method can be provided such that the detecting has detecting the test signal that has been output from the driver and passed through the short board by the comparator, and setting, as a reference time for testing the semiconductor device for the comparator, a value obtained based on a time difference between a reference timing having a prescribed time difference with respect to the generating and a time at which the test signal is detected in the detecting.

According to the still other aspect of the present invention, a calibration method for calibrating a processing timing of a semiconductor testing apparatus can be provided such that the semiconductor testing apparatus has a socket including a first terminal capable of supplying a test signal to the semiconductor device when a semiconductor device is mounted on the semiconductor testing apparatus, and a second terminal which receives an electric signal from the semiconductor device, a driver which outputs the test signal to the first terminal, and a comparator which receives a signal from the second terminal. This calibration method has mounting onto the socket a short board having a short pattern which electrically connects the first terminal with the second terminal, outputting the test signal from the driver, measuring in the comparator the test signal that has been output from the driver and passed through the short board, and setting, as a reference time that is used to test the semiconductor device for the comparator, a value obtained based on a time difference between a reference timing having a prescribed time difference with respect to the test signal outputting and a time at which the test signal is measured in the test signal measuring.

A calibration method can be provided such that the semiconductor testing apparatus has a plurality of the drivers and a plurality of the comparators. The socket has a plurality of the first terminals corresponding to the plurality of the drivers and a plurality of the second terminals corresponding to the plurality of the comparators, and the short board has a plurality of the short patterns which connect the plurality of the first terminals with the second terminals, respectively. In the setting, the reference time is set for each of the plurality of the comparators independently of each other.

According to the still other aspect of the present invention, a calibration method for calibrating a processing timing of a semiconductor testing apparatus can be provided such that the semiconductor testing apparatus has a driver which outputs a test signal for testing a semiconductor device, a comparator which receives an electric signal from the semiconductor device, a socket capable of supplying the test signal to the semiconductor device when the semiconductor device is mounted on the semiconductor testing apparatus. The calibration method has a providing a desired connection to a measuring apparatus which measures a wave form of the test signal so as to supply the test signal or the electric signal, measuring in the measuring apparatus the test signal output from the driver, judging whether a wave form of the test signal measured by the measuring apparatus lies within a prescribed range or not, reporting that a connection made to the measuring apparatus is a failure when the wave form measured by the measuring apparatus lies outside the prescribed range.

A calibration method can be provided such that a rising wave form or falling wave form of the test signal is measured in the measuring.

A calibration method can be provided such that the reporting has repeating the connecting, the wave form measuring, and the wave form judging when the wave form lies outside the prescribed range, and reporting that the connection made to the measuring apparatus is a failure when the wave form lies outside the prescribed range after the providing, the measuring, and the judging have been repeated by a prescribed number of times.

A calibration method can be provided such that the measuring apparatus is installed outside the semiconductor testing apparatus, and the measuring apparatus has an electric characteristic test probe for inputting the test signal. The providing includes carrying out a necessary connection so as to supply the test signal to the an electric characteristic test probe.

A calibration method can be provided such that the measuring apparatus is installed inside the semiconductor testing apparatus, and the measuring includes measuring in the measuring apparatus the test signal, which has been output from the driver, reflected by the socket, and input from the comparator.

A calibration method can be provided such that the measuring apparatus is installed inside of the semiconductor testing apparatus, and the measuring includes measuring in the measuring apparatus a prescribed reference signal that has been input from the comparator.

A calibration method can be provided such that the providing includes connecting a test board, which inputs the test signal and provides the test signal to the measurement apparatus, with the measurement apparatus for the calibration.

A calibration method can be provided such that the measuring apparatus is installed inside the semiconductor testing apparatus, and the measuring includes measuring in the measuring apparatus the test signal, which has been output from the driver, reflected by the test board, and input from the comparator.

A calibration method can be provided such that the judging judges whether a level of the test signal during a rising or falling of the test signal lies within a prescribed range or not.

According to the still other aspect of the present invention, a semiconductor testing apparatus for testing an electric characteristic of a semiconductor device is provided. The semiconductor testing apparatus has a socket having a first terminal which contacts the semiconductor device and supplies a signal to the semiconductor device, a test board, which has a pin arrangement identical to a pin arrangement of the semiconductor device, capable of being mounted onto the socket, a driver which outputs a test signal to the first terminal, and an output timing setting unit for setting an output timing at which the driver outputs the test signal using the test signal that has been output from the driver and reached the test board.

A semiconductor testing apparatus can be provided such that the test board has a signal wire pattern for contacting the first terminal and an earth pattern that is arranged adjacent to the signal wire pattern.

A semiconductor testing apparatus can be provided such that the test board has a signal wire pattern for contacting the first terminal and connecting the first terminal to earth, and the output timing setting unit sets the output timing using the test signal that has been output from the outputting unit and reflected by the test board.

A semiconductor testing apparatus can be provided such that the test board has a test pin that contacts the first terminal and has an input impedance that is equal to an input impedance of a pin of the semiconductor device.

A semiconductor testing apparatus can be provided such that the semi conductor testing apparatus further has a delay circuit which supplies a desired delay to the test signal, the output timing setting unit having a generating unit for outputting the test signal and generating a prescribed reference signal, and the output timing setting unit which sets the output timing by setting a size of a delay supplied by the delay circuit.

A semiconductor testing apparatus can be provided such that the semiconductor testing apparatus further has a plurality of the drivers and a plurality of delay circuits corresponding to the plurality of the divers, and the socket having a plurality of the first terminals corresponding to each of the plurality of the drivers, and the test board having a plurality of signal wire patterns corresponding to each of the plurality of the first terminals.

A semiconductor testing apparatus can be provided such that shortest distances between the plurality of the signal wire patterns and the earth pattern are substantially same.

A semiconductor testing apparatus can be provided such that the socket further has a second terminal which contacts the semiconductor device and receives an electric signal from the semiconductor device. The semiconductor testing apparatus further has a short board including a short pattern which electrically connects the first terminal with the second terminal and a comparator for measuring the test signal that has been output from the driver and passed through the short board.

A semiconductor testing apparatus can be provided such that the semiconductor testing apparatus further has a reference time setting unit for setting, as a reference time that is used to test the semiconductor device for the comparator, a value obtained based on a time from a reference timing having a prescribed time difference with respect to the test signal output to a time at which the test signal is measured in the comparator.

A semiconductor testing apparatus can be provided such that the semiconductor testing apparatus has a plurality of the drivers and a plurality of the comparators, the socket that has a plurality of the first terminals corresponding to the plurality of the drivers and a plurality of the second terminals corresponding to the plurality of the comparators, and the short board that has a plurality of the short patterns which connect the plurality of the first terminals with the second terminals, respectively. In the reference time setting unit, the reference time is set for each of the plurality of the comparators independently of each other.

A semiconductor testing apparatus can be provided such that the semiconductor testing apparatus further has a plurality of the sockets, a plurality of the test boards corresponding to each of a plurality of the sockets, a frame which holds a plurality of the test boards, and the frame having a take-in structure to shift the test boards to desired positions when mounting the frame at prescribed position on the semiconductor testing device.

According to the still other aspect of the present invention, a semiconductor testing apparatus for testing an electric characteristic of a semiconductor device can be provided. The semiconductor testing apparatus has a socket having a first terminal which contacts the semiconductor device and supplies an electric signal to the semiconductor device and a second terminal which contacts the semiconductor device and receives an electric signal from the semiconductor device, a driver which outputs a test signal to the first terminal, a short board which electrically connects the first terminal to the second terminal, a comparator which receives a signal input from the second terminal, a test signal detecting unit which detects in the comparator the test signal that has been output from the driver and passed through the short board, and a reference time setting unit for setting, as a reference time for testing the semiconductor device for the comparator, a value obtained based on a time difference between a reference timing having a prescribed time difference with respect to an output of the test signal output by the driver and a time at which the comparator has detected the test signal.

A semiconductor testing apparatus can be provided such that the semiconductor testing apparatus has a plurality of the drivers and a plurality of the comparators, the socket has a plurality of the first terminals corresponding to the plurality of the drivers and a plurality of the second terminals corresponding to the plurality of the comparators, and the short board has a plurality of signal wire patterns which connect the plurality of the first terminals with the second terminals, respectively. In the reference time setting unit, the reference time is set for each of the plurality of the comparators independently of each other.

A semiconductor testing apparatus can be provide such that the semiconductor testing apparatus further has a plurality of the sockets, a plurality of the short boards corresponding to each of a plurality of the sockets, a frame which holds a plurality of the short boards, and the frame having a take-in structure to shift the short boards to desired positions when mounting the frame on prescribed position.

DETAILED DESCRIPTION OF THE INVENTION

In what follows, the present invention will be explained with embodiments of the present invention. However, the following embodiments do not restrict the scope of the invention described in the claims. Moreover, not all the combinations of the characteristics of the present invention described in the embodiments are essential to the problem solving means by the present invention.

Figure 1:
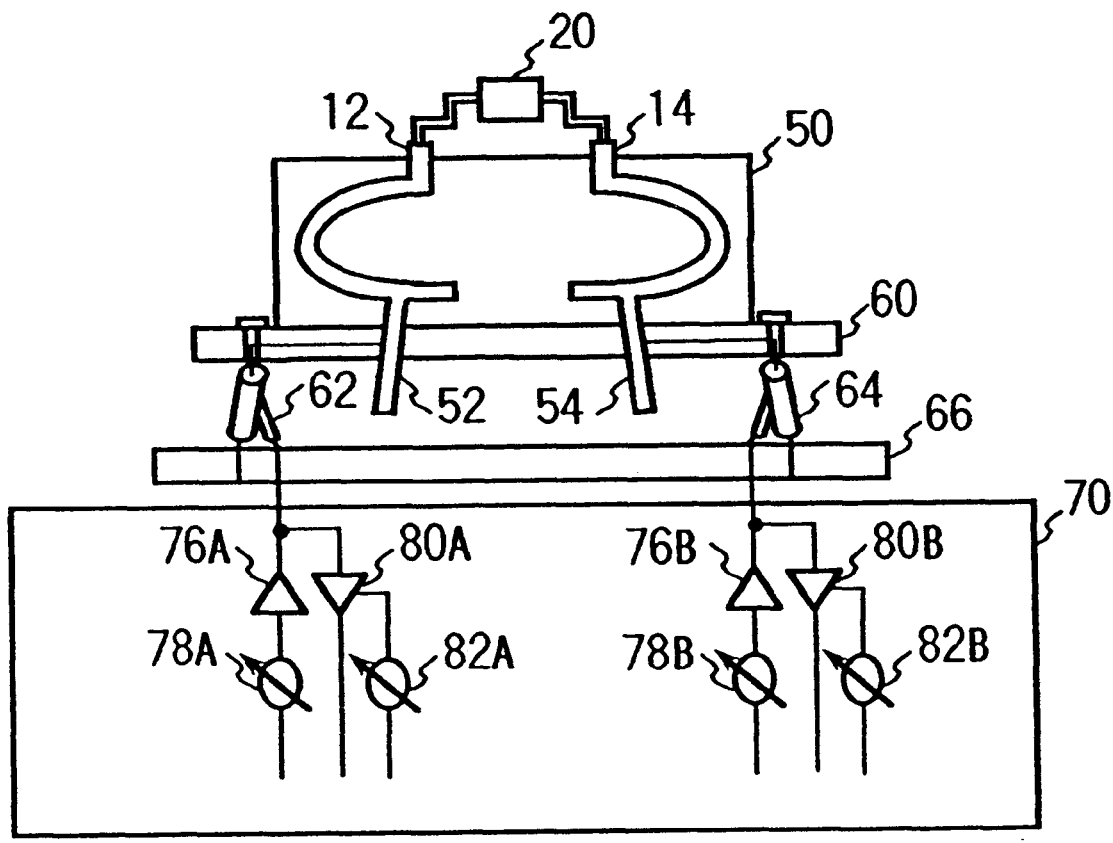
FIG. 1 is a cross sectional view of a conventional semiconductor testing apparatus.
Figure 2A:
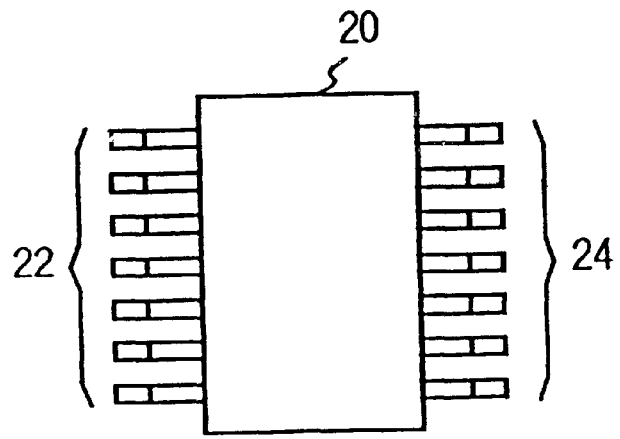
FIG. 2(a) is a top view of the semiconductor device 20.
Figure 2B:
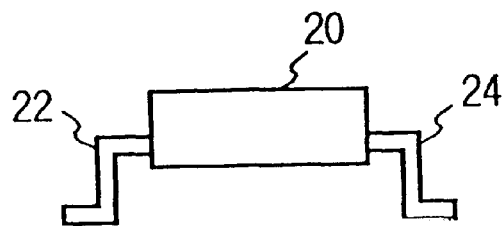
FIG. 2(b) is a front view of the semiconductor device 20.
Figure 3:
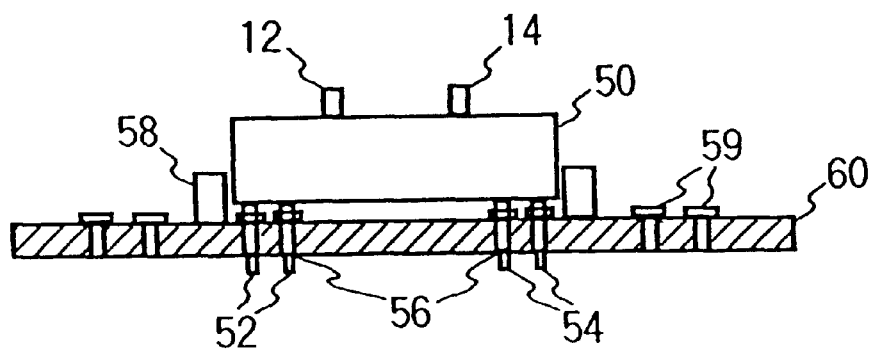
FIG. 3 is a cross sectional view of the socket 50 and the socket board 60 on which the socket 50 is mounted.
Figure 4:
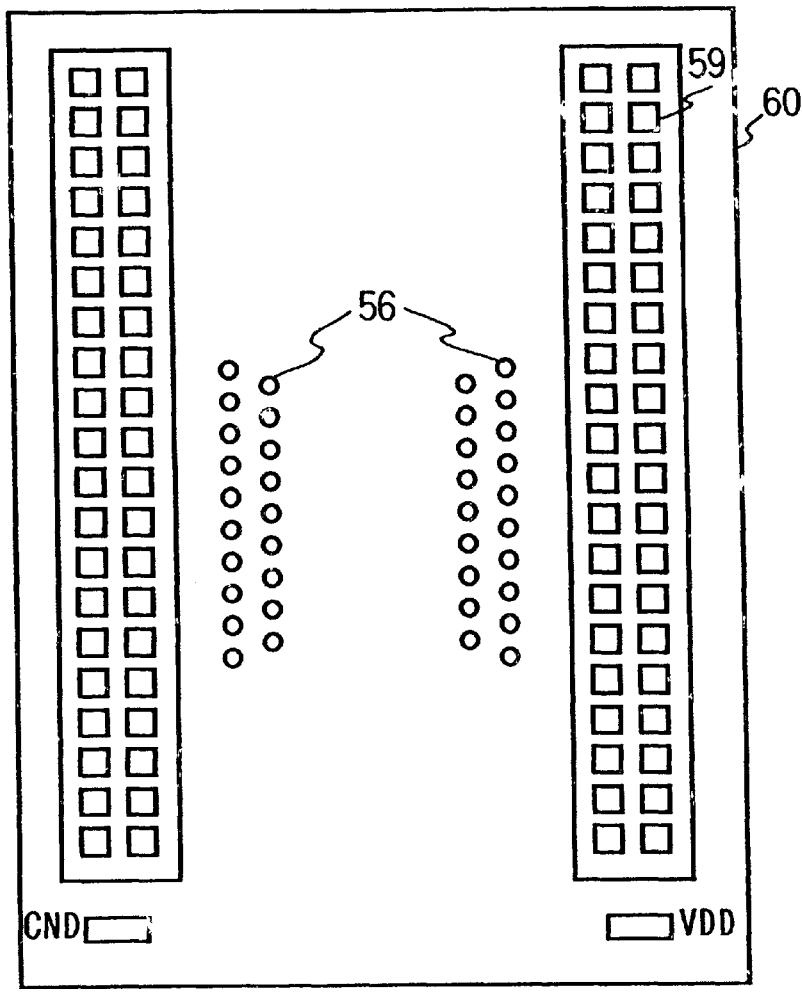
FIG. 4 is a top view of the socket board 60.
Figure 5:
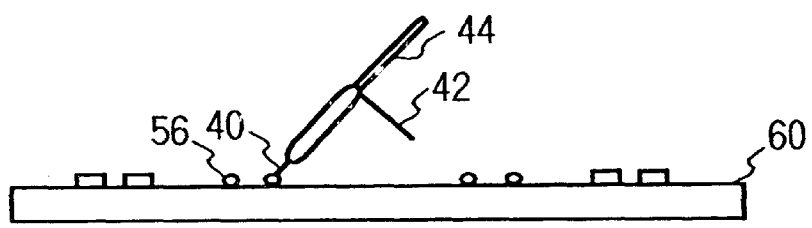
FIG. 5 shows a state in which the probe 44 is in contact with the socket board 60.
Figure 6:
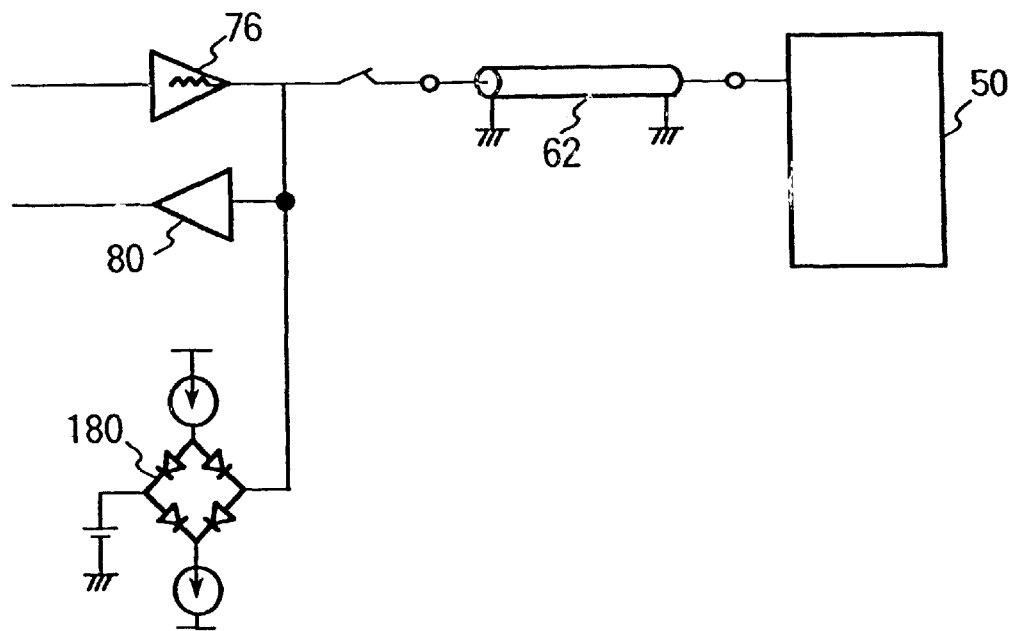
FIG. 6 shows another conventional method for calibrating the semiconductor testing apparatus.
Figure 7:
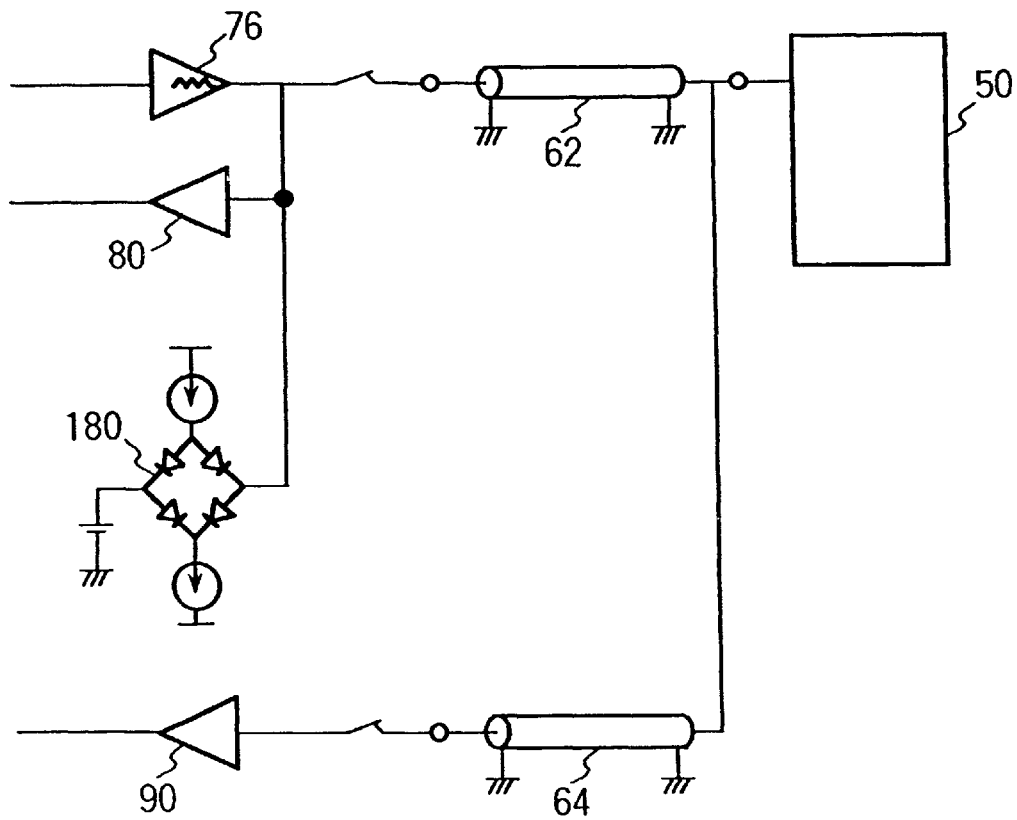
FIG. 7 shows further another embodiment of the conventional semiconductor testing apparatus.
Figure 8:
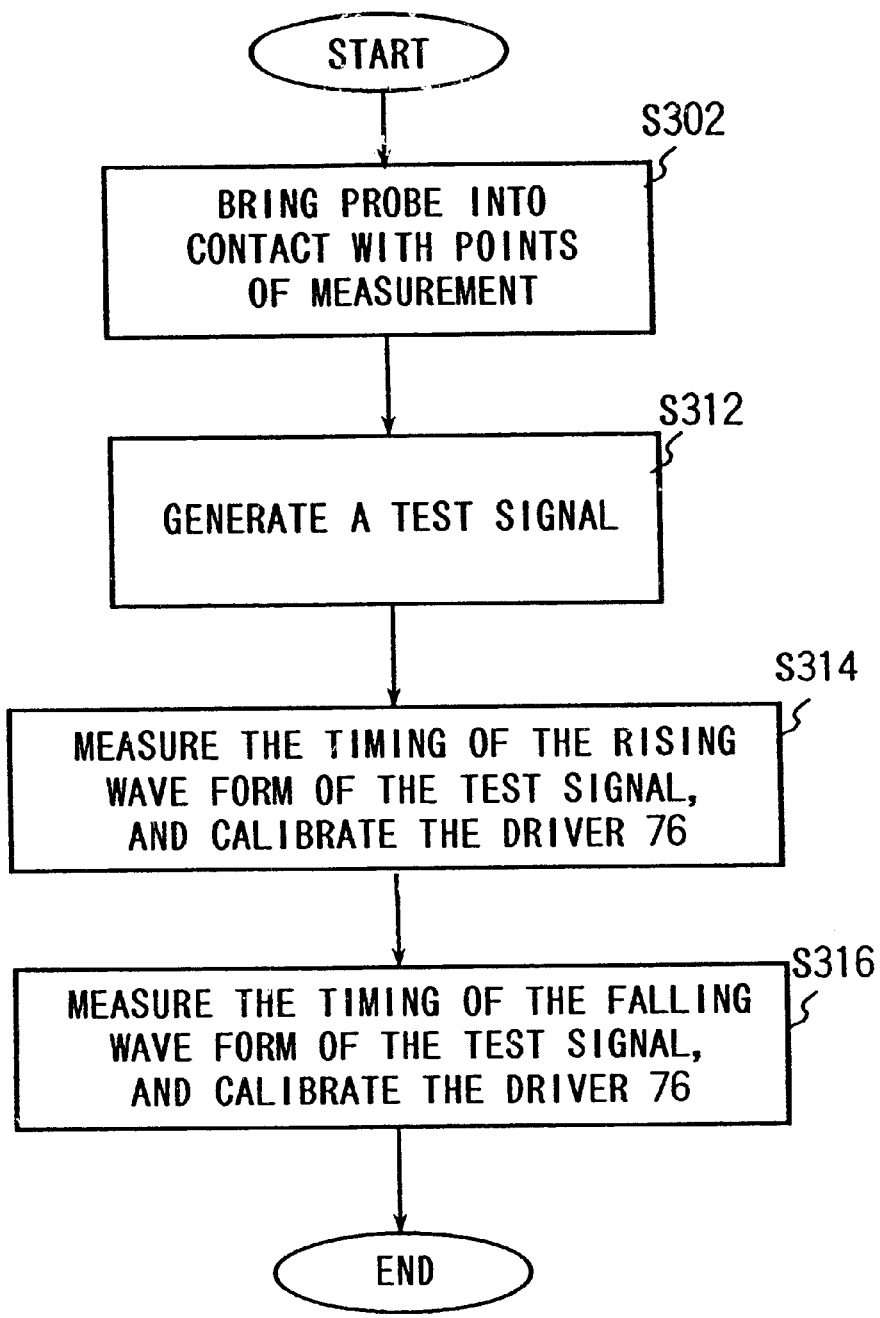
FIG. 8 is a flow chart showing a conventional calibration method.
Figure 9A:
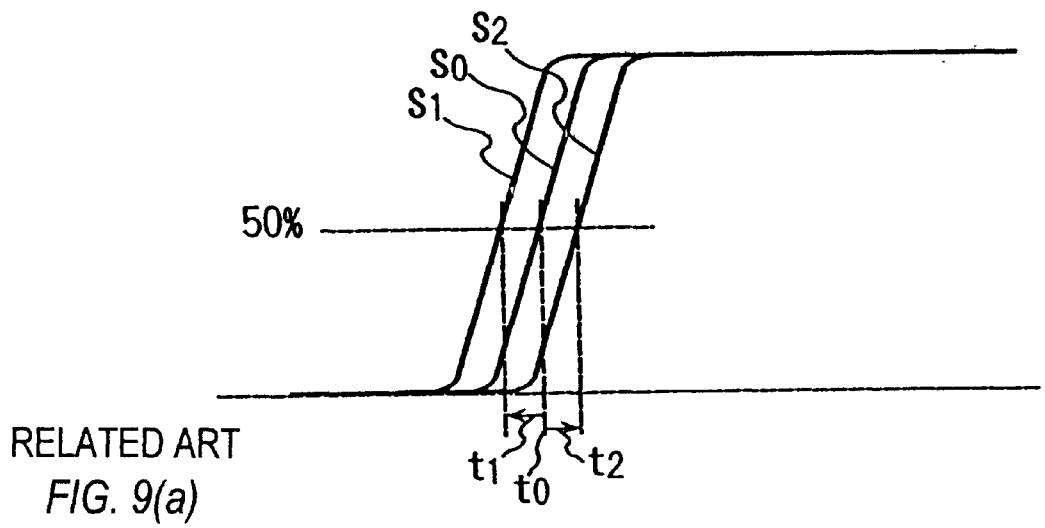
FIG. 9 shows the wave form of the test signal measured in the timing measuring S310.
Figure 9B:
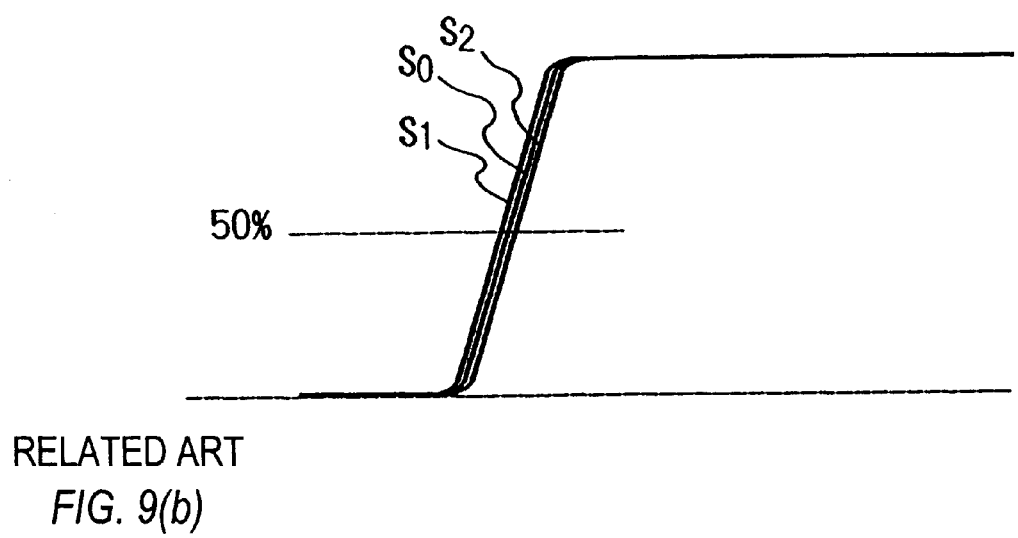
Figure 9C:
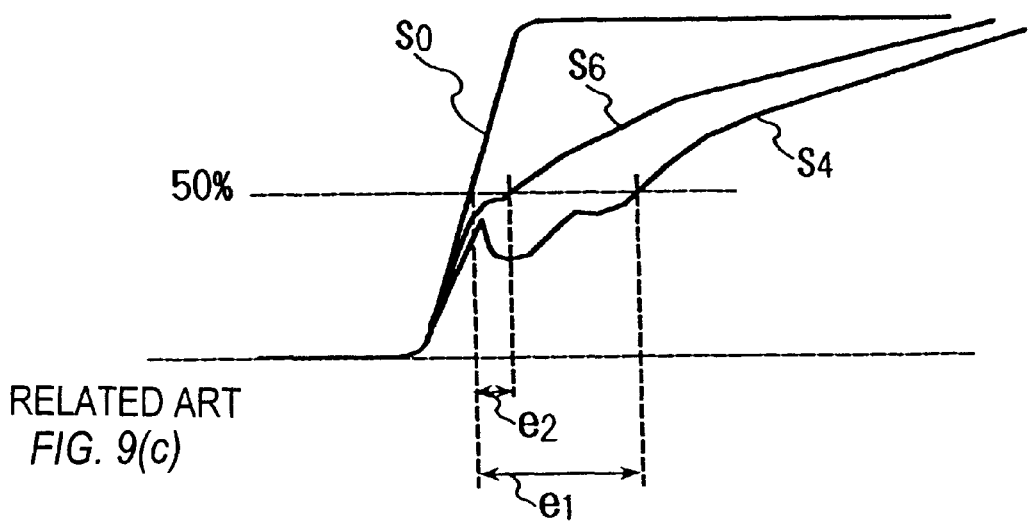
Figure 10:
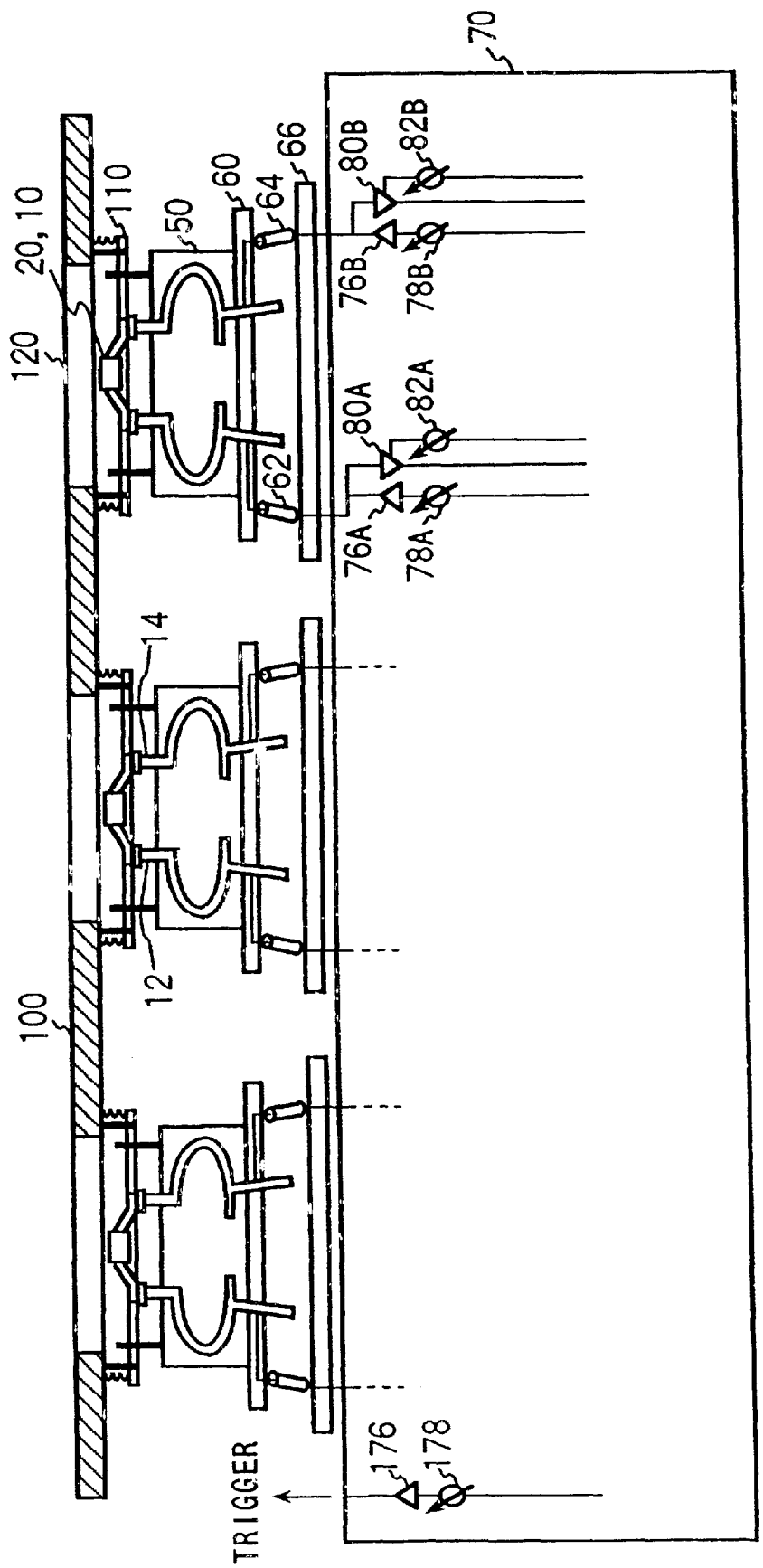
FIG. 10 is a cross sectional view of a semiconductor testing apparatus according to the present embodiment.

FIG. 10 is a cross sectional view of a semiconductor testing apparatus according to the present embodiment. The same reference numerals are given to those components that are already used in FIG. 1. Such components will not be explained again here. Installed on the socket board 60 are multiple sockets 50 connected to a performance board via coaxial cables 62 and 64. Moreover, multiple holding units 110 are mounted on the frame 100. The opening unit 120 is installed at the top portion of each holding unit 110. Each holding unit 110 holds one semiconductor device 20. Only those circuits connected to the two coaxial cables 62 and 64 are shown inside the test head 70. However, in reality, a coaxial cable is installed for each of the pins of the semiconductor device 20. A driver 76, a delay circuit 78, a comparator 80, and a comparator delay circuit 82 are installed for each coaxial cable. Moreover, only those circuits connected to one semiconductor device 20 are shown in the drawing. However, in reality, the same circuits are installed for each semiconductor device.

The present semiconductor testing apparatus is able to test multiple semiconductor devices simultaneously in a given amount of time. In calibrating the semiconductor testing apparatus, a test board 10 is installed on each holding unit 110 in place of the semiconductor device 20. When the frame 100 is installed on the semiconductor testing apparatus, the test board 10 is installed on the socket 50. Next, a probe is applied to the test board from above the opening unit 120. The driver 76 then generates a test signal. The test signal that has reached the test board 10 is detected by an oscilloscope. Based on the detected test signal, the setting of the delay circuit 78A is changed. Thus, the output timing of the test signal is set.

The driver 76 is installed for each of the multiple signals supplied to the semiconductor device 20. The test head 70 also has one driver 176 for generating a reference signal and a delay circuit 178 which supplies a prescribed delay to the reference signal. The time difference between the time at which the reference signal is generated and the time at which the driver 76 generates the test signal is held constant. Hence, this reference signal is input as a trigger to the oscilloscope. By setting the phase differences between the test signals output from the drivers 76 and the phase of the reference signal equal to each other, the phase differences between the multiple drivers 76 can be aligned indirectly. Thus, the skews between the drivers can be made small. However, as an alternative, one of the test signals that reaches the test board 10 may be selected as the reference signal and input as a trigger to the oscilloscope to match the phases of the other test signals to the phase of the selected test signal.

Figure 11A:
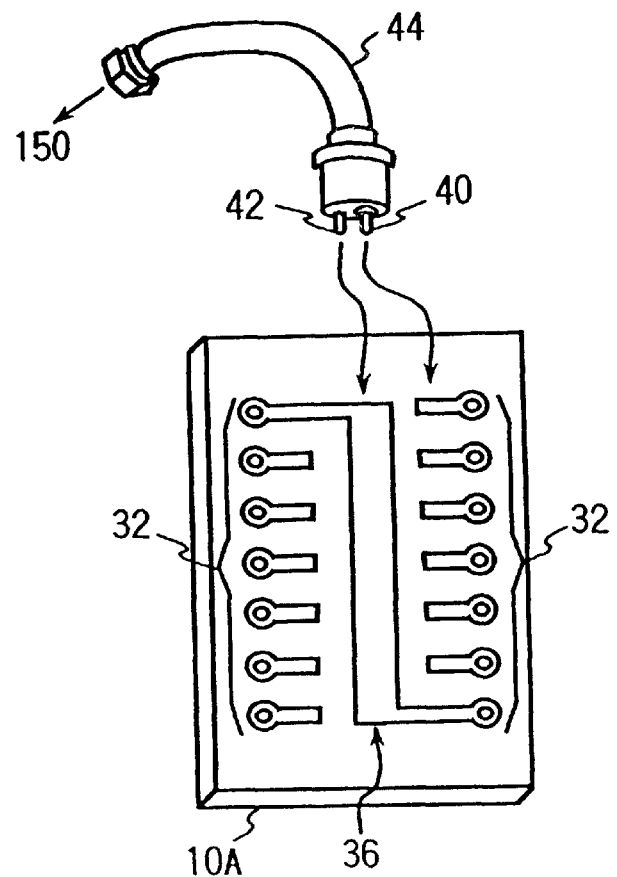
FIG. 11(a) is a top view of the probe board 10A as an example of the test board 10 installed on the holding unit 110.
Figure 11B:
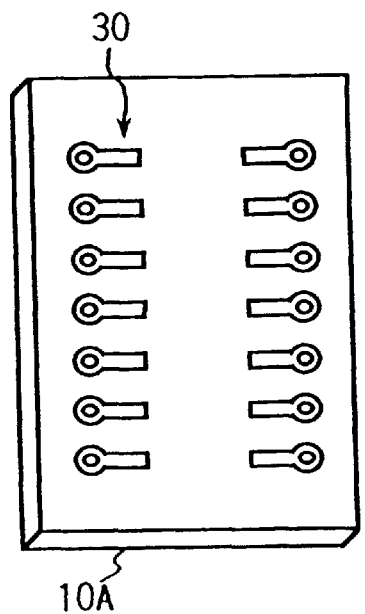
FIG. 11(b) is a bottom view of the probe board 10A as an example of the test board 10 installed on the holding unit 110.
Figure 12A:
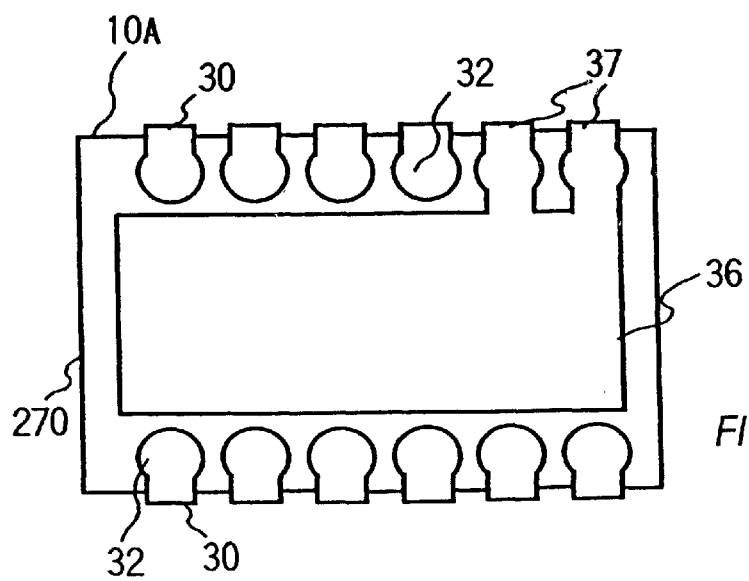
FIG. 12 shows another embodiment of the probe board 10A.
Figure 12B:
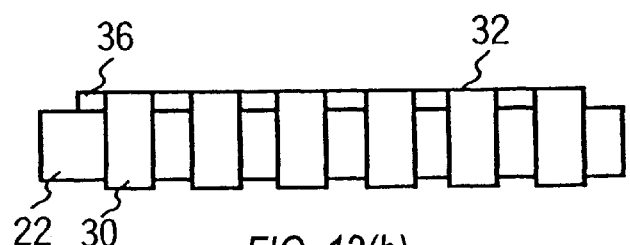
Figure 12C:
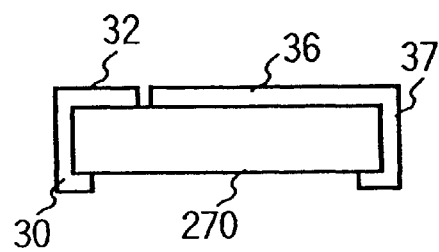
Figures 12D, 12E:
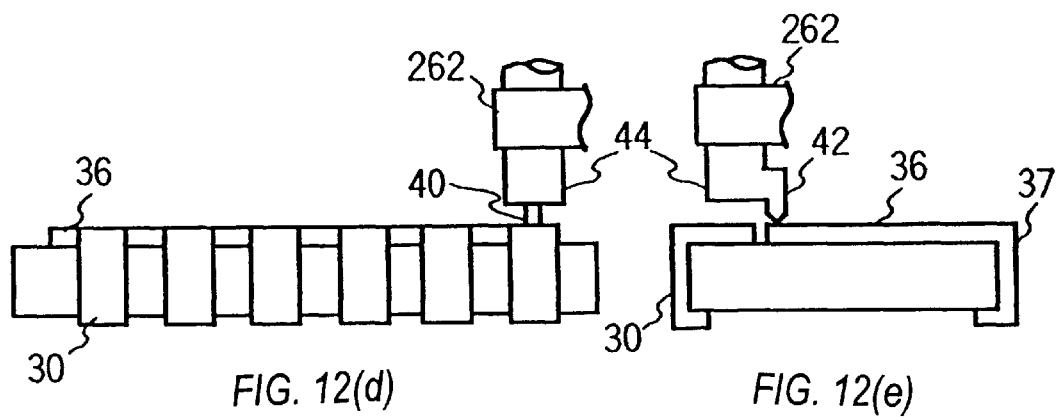

FIG. 11(a) is a top view of the probe board 10A as an example of the test board 10 installed on the holding unit 110. FIG. 11(b) is a bottom view of the probe board 10A as an example of the test board 10 installed on the holding unit 110. A contact terminal 30 is installed in the same manner as the terminal of the semiconductor device 20 on the bottom surface of the test board 10. When the frame 100 is installed on the semiconductor testing apparatus, the contact terminal 30 contacts the first terminal 12 and the second terminal 14 of the socket 50. The earth pattern 36 and the multiple signal wire patterns 32 installed on the top surface of the test board 10 are connected to the contact terminal 30 installed on the bottom surface of the test board 10. The earth pattern 36 is installed across the central portion of the top surface of the test board 10. The earth pattern 36 is adjacent to each of the signal wire patterns 32. The shortest distance from the earth pattern 36 to the set of signal wire patterns 32 is less than 2mm. Hence, the signal terminal 40 of the probe 44 and the earth terminal 42 can be easily brought into contact with the earth pattern 36 and each of the signal wire patterns 32. Moreover since the shortest distance from the earth pattern 36 to each of the signal wire patterns 32 is virtually equal, the variance of the set of line impedance of the signals is small. Hence, each of the signals can be measured accurately.

In order to prevent an error from being generated between the timing at which the driver 76 outputs a signal at the time of calibration and the timing at which the driver 76 outputs a signal when the actual semiconductor device 20 is installed on the semiconductor testing apparatus, it is desirable that the input impedance of each signal at the contact terminal 30 be set substantially equal to the input impedance of the signal at the semiconductor device 20. To accomplish this, it suffice to install an appropriate capacitor, and a resistor or the like between the signal wire patterns 32 and the earth patter 36.

FIG. 12 shows another embodiment of the probe board 10A. Multiple contact terminals 30 are installed on the side surface of the exterior circumference of the insulation block 270 having approximately the same outside diameter as the semiconductor device 20 in approximately the same arrangement as the terminals of the semiconductor device 20. The contact terminals 30 can contact the first terminal 12 and second terminal 14 of the socket 50 and the side or bottom surface of the insulation block 270.

Multiple signal wire patterns are formed by the multiple contact terminals 30 at positions on the extended peripheral portion of the top surface of the insulation block 270. The signal wire patterns 32 are used to contact the signal terminal 40 of the probe 44. Hence, each of the signal wire patterns 32 has a convex shape so that the signal terminal 40 can easily contact the signal wire patterns 32. The earth pattern 36 is extended from the ground terminal 37 and is formed inside the multiple signal wire patterns 32. The earth pattern 36 is used to contact the earth terminal 42 of the probe 44. The probe 44 is held by the holding jig 262.

The earth pattern 36 is in contact with each of the signal wire patterns 32. Hence, the signal wire patterns 32 and the earth pattern 36 can be easily brought into contact with the signal terminal 40 of the probe 44 and the earth terminal 42, respectively. Since the earth terminal 42 can be brought into contact with the earth pattern 36 via the shortest distance, the earth terminal 42 can be grounded with a low impedance. Therefore, the external noise conventionally superposed on the test signal via the ground impedance is reduced, the distortion of the test signal caused by the influence of the noise is suppressed, and the precision of the calibration is improved. Moreover, since the signal wire pattern 32 remains in stable contact with the signal terminal 40, the noise generated from the portion of contact between the signal wire pattern 32 and the signal terminal 40 and the distortion of the test signal caused by the noise are suppressed. As a result, the calibration precision is improved.

Figure 13A:
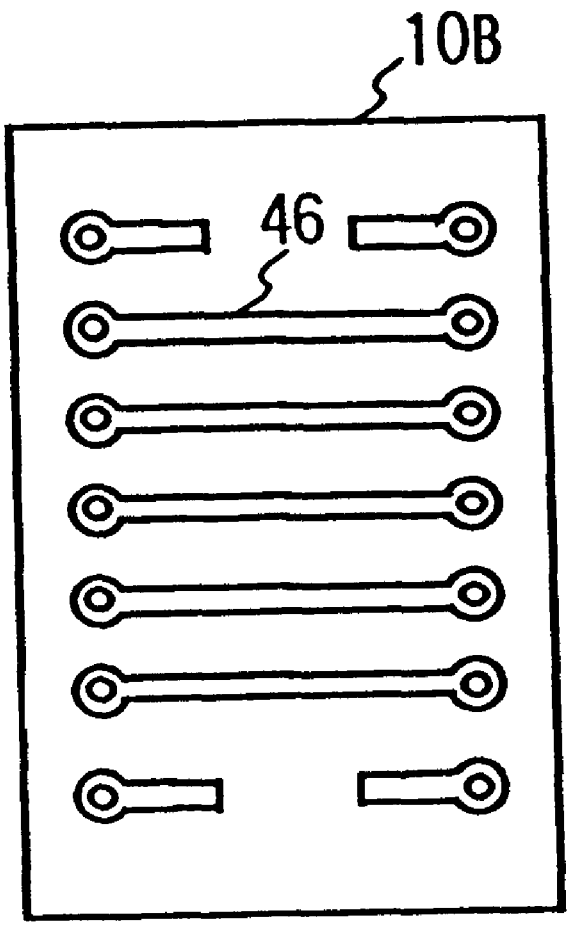
FIG. 13A is a top view of a short board 10B as another example of the test board 10.
Figure 13B:
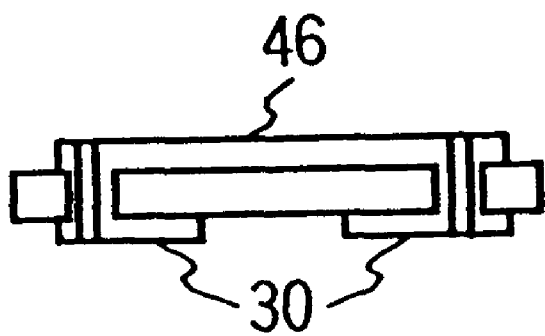
FIG. 13B is a side view of the short board 10B.

FIG. 13(a) is a top view of a short board 10B as another example of the test board 10. FIG. 13(b) is a side view of the short board 10B. A contact terminal 30 that contacts the first terminal 12 and second terminal 14 of the socket 50 are installed on the bottom surface of the short board 10B. Multiple short patterns 46 for shorting the contact terminal 30 that is in contact with the first terminal 12 with the contact terminal 30 that is in contact with the second terminal 14 are installed. After installing the probe board 10A shown in FIG. 11 on the semiconductor testing apparatus and calibrating the skews between the multiple drivers 76, the probe board 10A is removed from the semiconductor testing apparatus. The short board 10B is then installed on the semiconductor testing apparatus in place of the probe board 10A.

In this state, the skews between the multiple comparators 80 are calibrated. First, test signals are simultaneously generated from the multiple drivers 76A. The test signals generated by the multiple drivers 76A return to the comparator 80B reflected by the short board 10B. The approximate length of delay time from the time at which the drivers 76 generate the test signals to the time at which the comparoator 80 detects the test signals is known. Hence, for example, the time obtained by having the oscilloscope 150 add the known delay time to the time at which the reference signal as a trigger is supplied to the oscilloscope 150 is selected as the reference timing. However, as an alternative, the time at which the reference signal is detected may be selected as the reference timing. This corresponds to the case in which "0" is selected as the delay time.

Next, the time difference between the reference timing and the time at which each comparator 80 has detected the test signal is measured for each comparator 80. The value based on this time difference is set as the reference time for testing the semiconductor device 20 for each comparator 80. For example, when the time difference associated with a specific comparator 80 is +a, the time a is subtracted from the delay time of the comparator delay circuit 82 that corresponds to the specific comparator 80. Similarly, when the time difference associated with a specific comparator 80 is −a, the time a is added to the delay time of the comparator delay circuit 82 that corresponds to the specific comparator 80. Thus, the skews between the multiple comparators 80 can be calibrated.

As another embodiment, a memory for storing the delay time may be installed for each of the multiple comparators 80 in place of the comparator delay circuit 82 to store the above-mentioned time differences in the memory. In this case, the time difference stored in the memory is subtracted from the time at which the comparator 80 has detected the test signal when the semiconductor device 20 is tested. In this way, the influence of the skews between the comparators 80 can be canceled with each other. For such a memory, a semiconductor digital memory or an analog memory, or a delay circuit in which the delay time can be set, or the like can be used. As a means for subtracting the time difference, an analog operation circuit or a delay circuit can be used besides a numerical subtraction operation.

Figure 14:
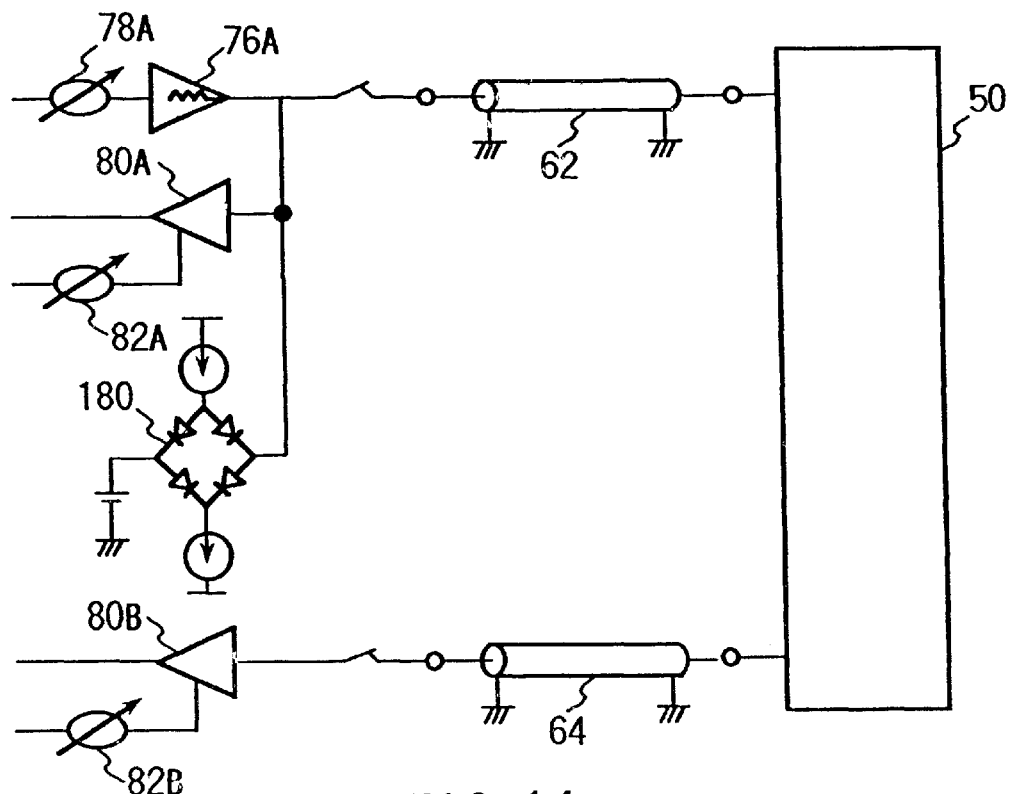
FIG. 14 shows another embodiment of the semiconductor testing apparatus.

FIG. 14 shows another embodiment of the semiconductor testing apparatus. The same reference numerals are given to those components that have already been used in FIG. 10. Such components will not be explained here again. In the present embodiment, only a comparator 80B and a comparator delay circuit 82B are connected to the coaxial cable 64 that corresponds to the output terminal of the semiconductor device 20. The driver 76B and driver delay circuit 78B shown in FIG. 10 are omitted here. Moreover, a programmable load 180 which supplies a load of desired level to the driver 76A is installed parallel with the driver 76A and comparator 80A.

First, the semiconductor device 20 and the test board 10 are removed from the socket 50. Then, the delay time caused by the driver delay circuit 78A and the delay time caused by the comparator delay circuit 82A are set to "0". Next, the length of time t1 from the time at which the output voltage of the driver 76A is changed to the time at which the comparator 80A detects the reflected current, that is, the length of time the test signal requires to make a round trip between the driver 76A and the socket 50 is measured. By dividing this time t1 by 2, the length of time (t1)/2 between the time at which the driver 76A has generated the test signal and the time at which the test signal is transmitted to the socket 50 is obtained. The transmission time (t1)/2 of the test signal is measured for each of the drivers 76A. Thus, the time differences Δdr between the test signals that are transmitted from the multiple drivers 76 to the socket 50 can be obtained.

Figure 15:
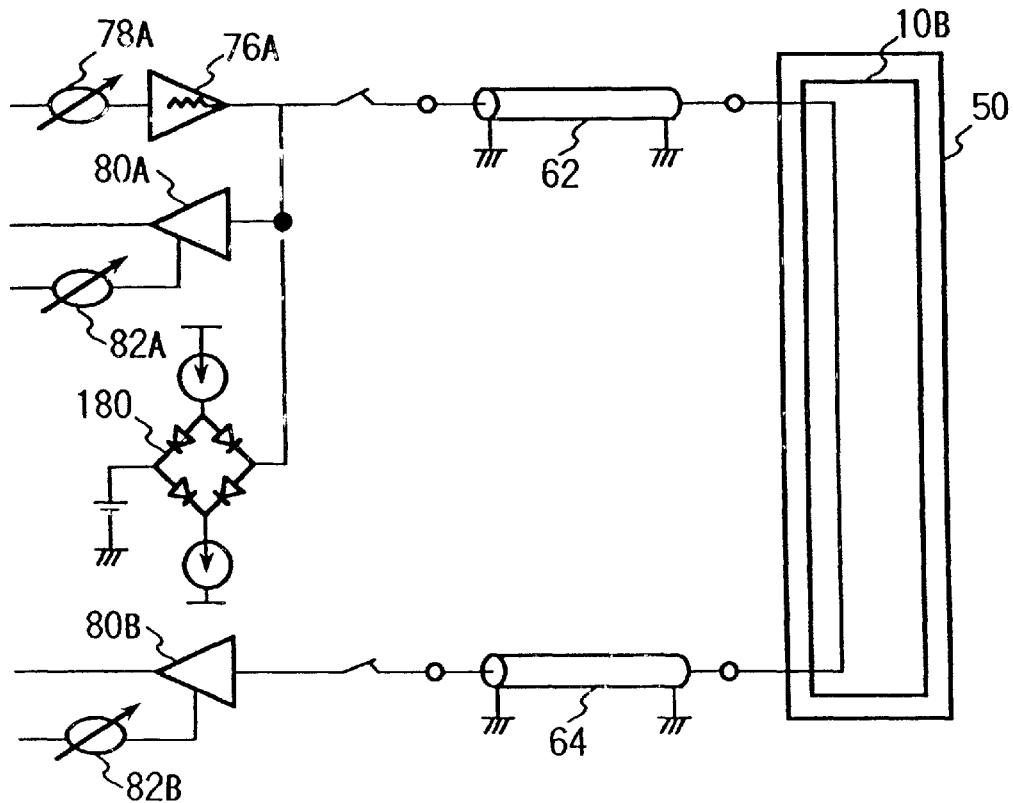
FIG. 15 shows a method for easily obtaining the signal transmission time from the socket 50 to the comparator 80B.

FIG. 15 shows a method for easily obtaining the signal transmission time from the socket 50 to the comparator 80B. The short board 10B is attached to the socket 50 to generate a test signal at the driver 76A. The test signal passes through the coaxial cable 62, the short board 10B, and the coaxial cable 64, and is received by the comparator 80B. The length of time t2 between the time at which the river 76 has generated the test signal and the time at which the comparator 80B receives the test signal, that is, the signal transmission time between the driver 76 and the comparator 80B, is measured. t2 is then subtracted from the transmission time (t1)/2 between the driver 76 and the socket 50. In this way, the signal transmission time t3 from the socket 50 to the comparator 80B is obtained. By measuring the signal transmission time t3 for each of the comparators 80B, the time difference Δcp between the test signals that are transmitted from the socket 50 to the comparator 80B through different paths can be obtained.

By changing the delay time that is set for the driver delay circuit 78 based on the time difference Δdr associated with the paths on the driver 76A side, the skews between the drivers 76A can be canceled with each other. Moreover, by changing the delay time that is set for the comparator 80B delay circuit 82B based on the time difference Δcp associated with the paths on the driver 76A side, the skews between the comparator 80B can be canceled with each other.

Figure 16:
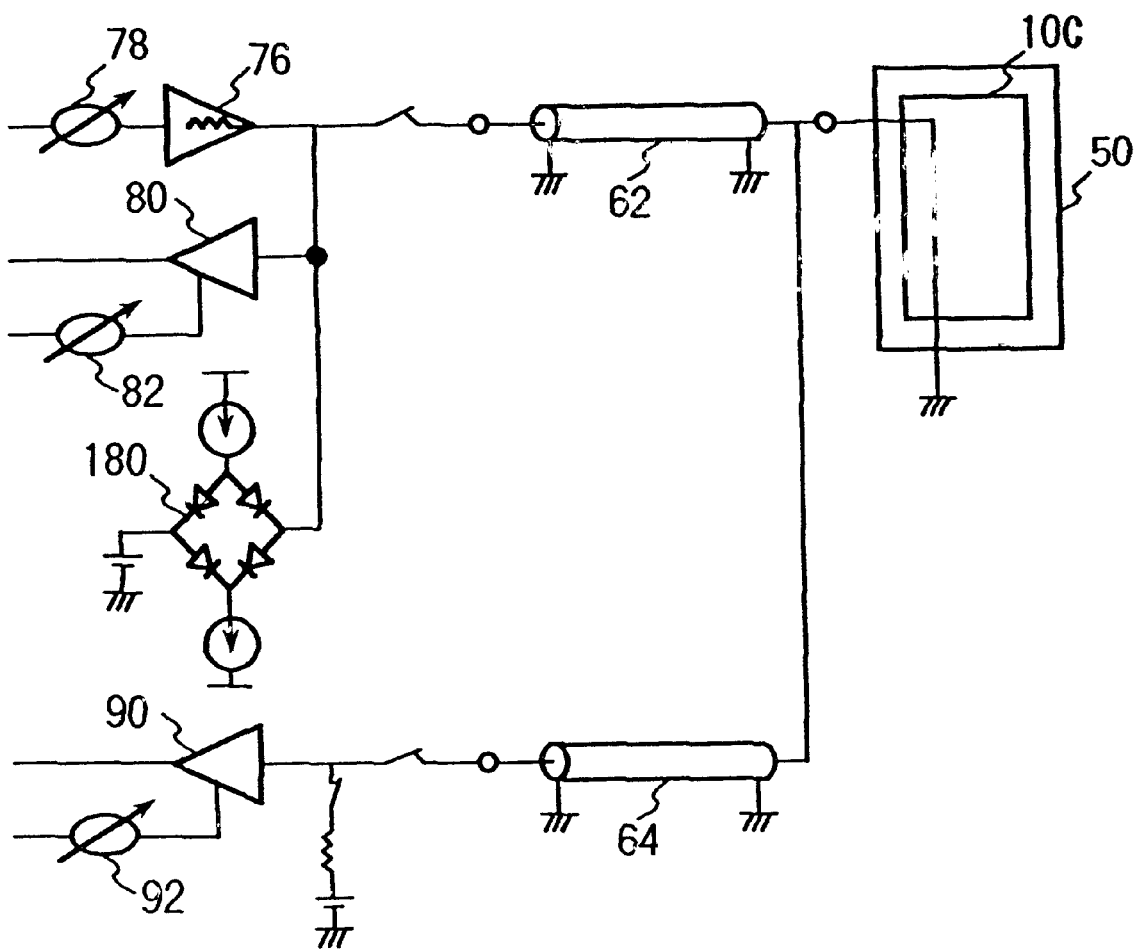
FIG. 16 shows further another embodiment of the semiconductor testing apparatus.

FIG. 16 shows further another embodiment of the semiconductor testing apparatus. In the present embodiment, two coaxial cables are connected to one terminal of the socket 50. In this case, impedance mismatching does not occur when the semiconductor device 20 and the test board 10 are removed. Therefore, the signal transmission time from the driver 76 to the socket 50 and the signal transmission time from the socket 50 to the comparator 90 cannot be obtained. Hence, an earth short board 10C as an example of the test board 10 is first installed to the socket 50. In the earth short board 10C, each test signal is shorted to the earth. As a result, impedance mismatching is generated in the earth short board 10C. Thus, the signal generated by the driver 76 is reflected by the comparator 80.

Next, the earth board 10C is removed from the socket 50 in FIG. 16. The delay time in the delay circuit 92 for the comparator 90 is then set to zero "0". Moreover, when the test signal is generated by the driver 76, the test signal is transmitted to the comparator 90 via the coaxial cables 62 and 64 as in the case shown in FIG. 15. The signal transmission time t2 from the driver 76 to the comparator 90, that is, the length of time from the time at which the driver 76 generates the test signal to the time at which the comparator 90 receives the test signal, is measured. By subtracting from t2 the signal transmission time (t1)/2 between the socket 50 and the driver 76, the signal transmission time t3 between the socket 50 and the comparator 90 can be obtained. By measuring the signal transmission time t3 between the socket 50 and the comparator 90, the time difference Δcp between the test signals that are transmitted from the socket 50 to the comparators 90B through different paths can be obtained.

By changing the delay time that is set for the driver delay circuit 78 based on the time difference Δdr associated with the paths on the driver 76A side, the skews between the drivers 76A can be canceled with each other. Moreover, by changing the delay time that is set for the comparator 90 delay circuit 92 based on the time difference Δcp associated with the paths on the driver 76A side, the skews between the comparators 90 can be canceled with each other.

Figure 17A:
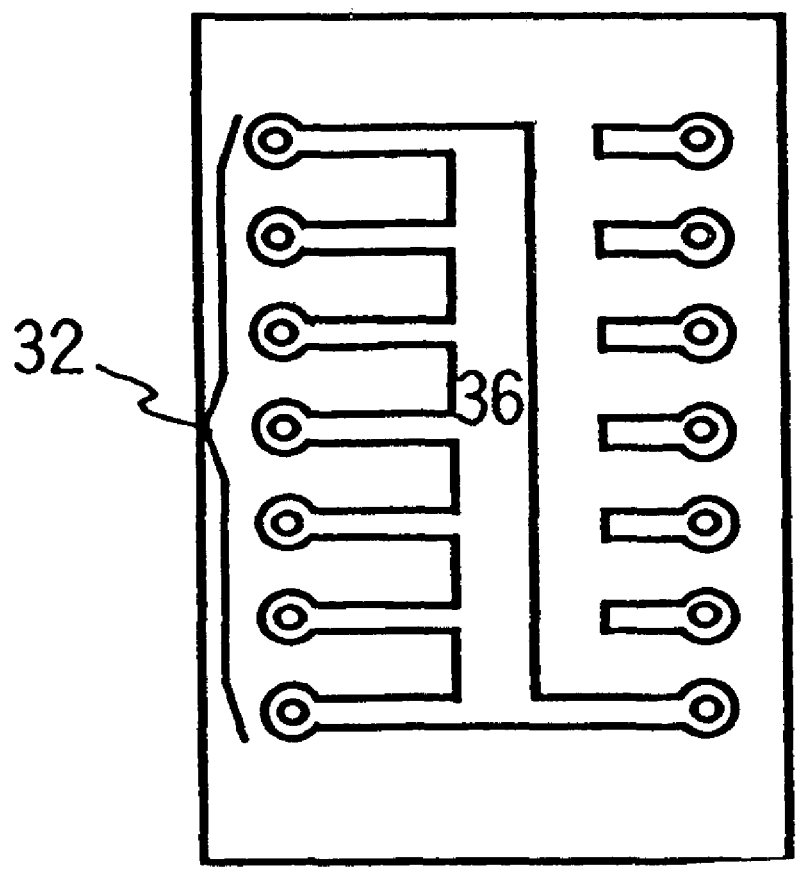
FIG. 17(a) is a top view of the earth short board 10C.
Figure 17B:
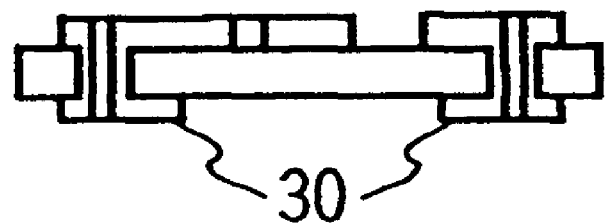
FIG. 17(b) is a side view of the earth short board 10C.

FIG. 17(a) is a top view of the earth short board 10C. FIG. 17(b) is a side view of the earth short board 10C. A contact terminal 30 that contacts the first terminal 12 and second terminal 14 of the socket 50 is installed on the bottom surface of the earth short board 10C. Signal wire patterns 32 that contact the first terminal 12 of the socket 50 are shorted to the earth pattern 36 on the top surface of the earth short board 10C. Hence, the line impedance of the test signal rapidly decreases to a small value after the earth short board 10C is shorted to the earth. Due to this impedance mismatching, the signal generated by the driver 76A is reflected by the earth short board 10C and is detected by the comparator 80A.

Figure 18:
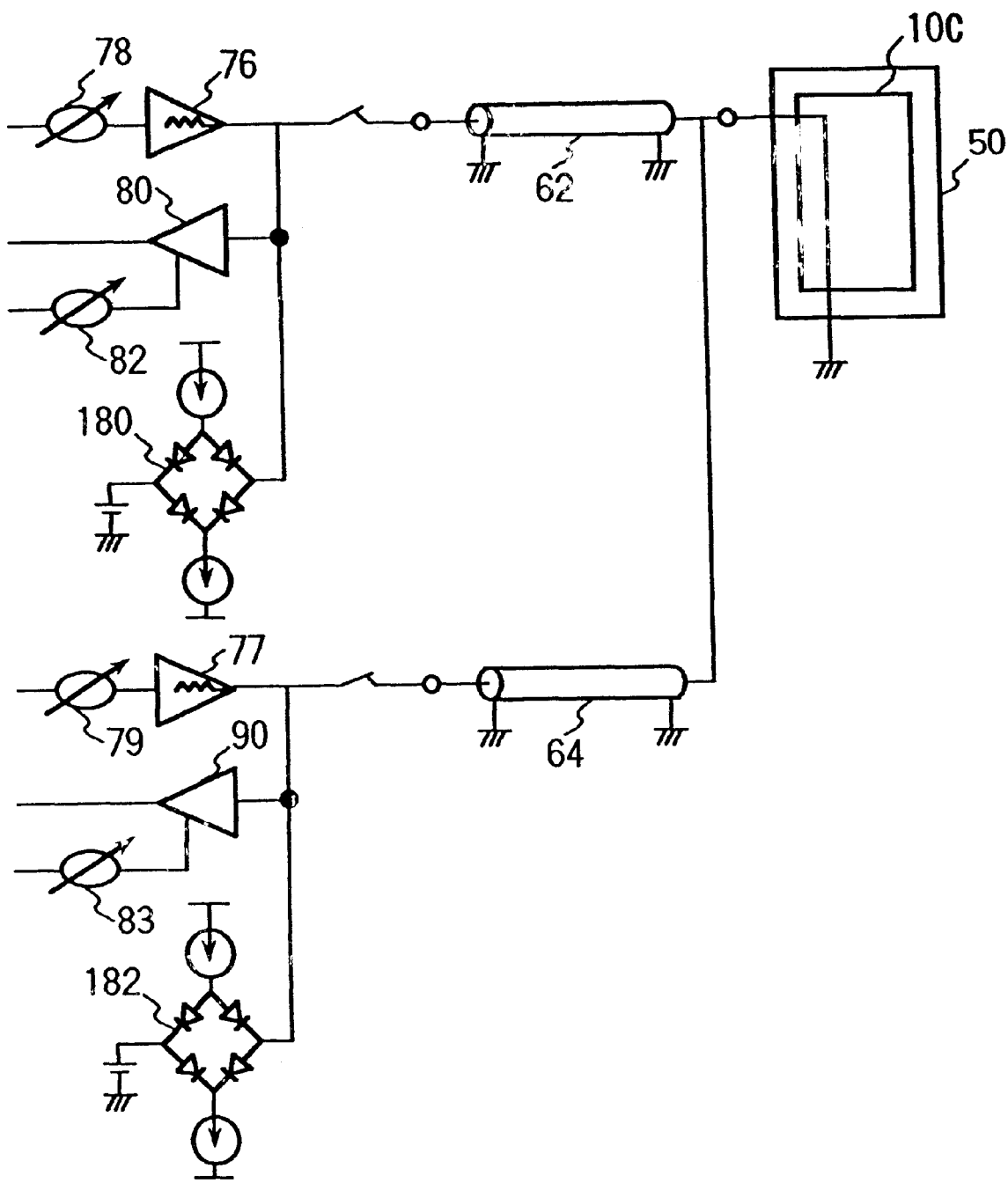
FIG. 18 shows further another embodiment of the semiconductor testing apparatus.

FIG. 18 shows further another embodiment of the semiconductor testing apparatus. In the present embodiment, two coaxial cables 62 and 64 are connected to one terminal of the socket 50. Connected to each coaxial cable are a driver, a driver delay circuit, a comparator, a programmable load, and a comparator delay circuit. In this case, the earth short board 10C is installed to the socket 50. Test signals are then generated from the drivers 76 and 77 sequentially. The test signals reflected by the socket 50 are detected by the comparators 80 and 90, respectively.

Thus, the time difference Δdr between the transmission delay time from the driver 76 to the socket 50 and the transmission delay time from the driver 77 to the socket 50 can be obtained. Based on this time difference Δdr, the skews between the multiple drivers 76, the skews between the multiple drivers 77, the skews between the multiple comparators 80, and the skews between the multiple comparators 90, can be calibrated using the delay circuits 78, 79, 82, and 83, respectively.

Figure 19:
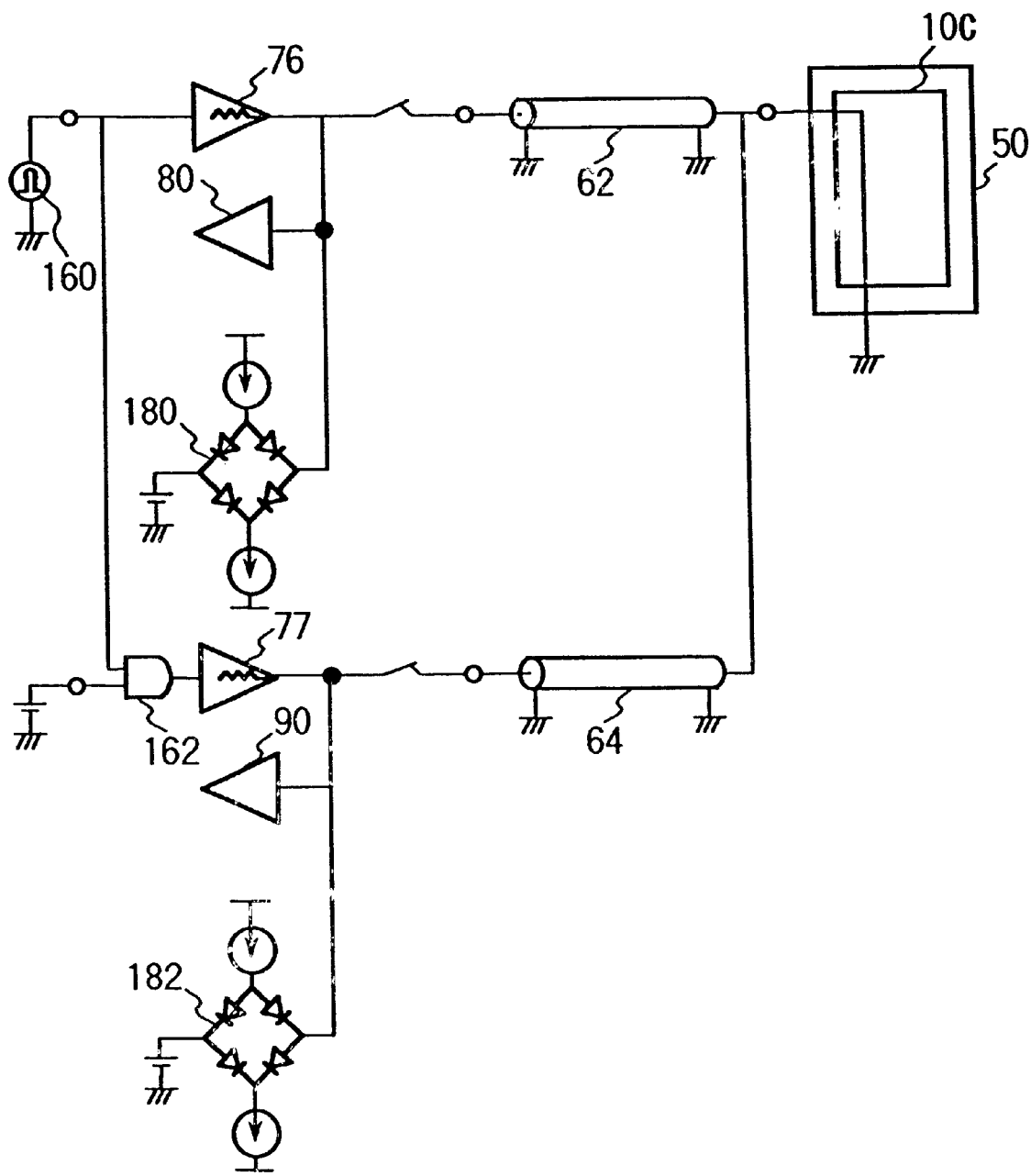
FIG. 19 shows a variational example of the semiconductor testing apparatus calibration method shown in FIG. 18.

FIG. 19 shows a variational example of the semiconductor testing apparatus calibration method shown in FIG. 18. To make the drawing comprehensible, the delay circuits 78, 79, 82, and 83 shown in FIG. 18 are omitted. Moreover, the same reference numerals are used for the same components that are already used in FIG. 18. Such components will not be explained here again. In the present embodiment, test signals can be supplied from one wave form shaper 160 to two drivers 76 and 77. Moreover, a gate 162 for controlling whether to pass the test signal or not is installed between the wave form shaper 160 and the driver 77. According to the present embodiment, there is no need to install a pattern generator for generating test signals or a wave form formatter or the like for each of the drivers 76 and 77. Therefore, the testing apparatus can be constructed inexpensively.

Figure 20:
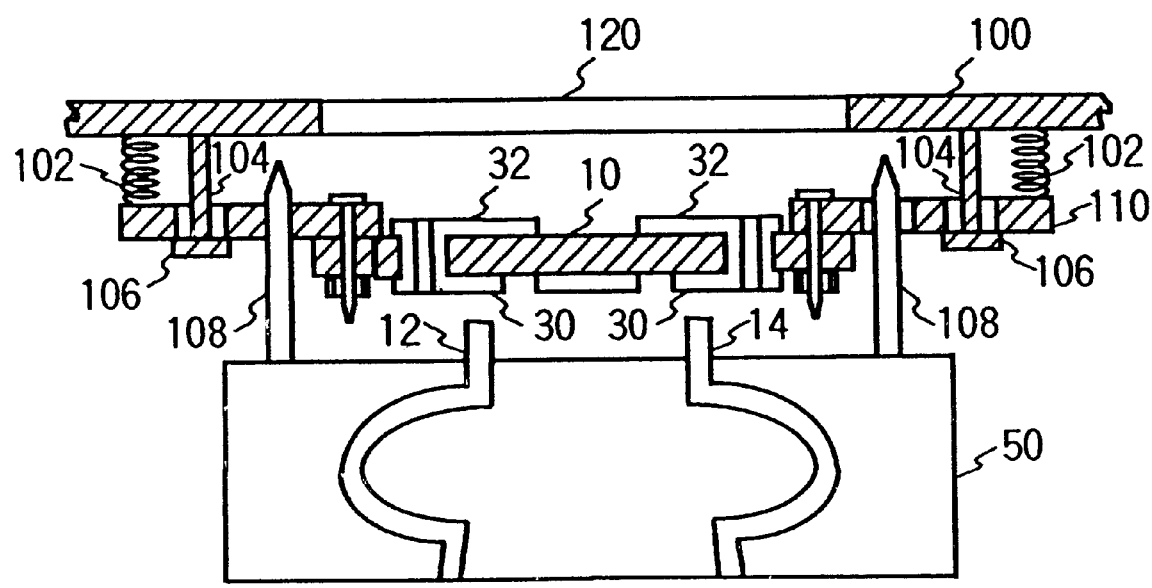
FIG. 20 is a magnified view of the opening unit 120 of the frame 100 the holding unit 1101, and the test board 110.

FIG. 20 is a magnified view of the opening unit 120 of the frame 100, the holding unit 110, and the test board 10. The circular column member 104 of the frame 100 is made to penetrate through the holding unit 110. The holding unit 110 is secured with the fastener 106. The holding unit 110 holds the test board 10 or the semiconductor device 20. Since a large clearance is formed between the holding unit 110 and the circular column 104, the holding unit 110 can be displaced freely with respect to the frame 100 within the range of the clearance. The spring 102 presses the holding unit 110 to the socket 50. A positioning bar 108 whose tip is cone-shaped is installed on the socket 50.

The positioning bar 108 functions as a call-in mechanism which calls in the holding unit 110 and the test board 10 to suitable positions, respectively. That is, by inserting the positioning bar 108 into positioning holes formed on the holding unit 110, the holding unit 110 is displaced to a suitable position. Hence, the first terminal 12 and the second terminal 14 of the socket 50 can accurately contact the test board 10 and the contact terminal 30 of the semiconductor device 20, respectively.

Figure 21:
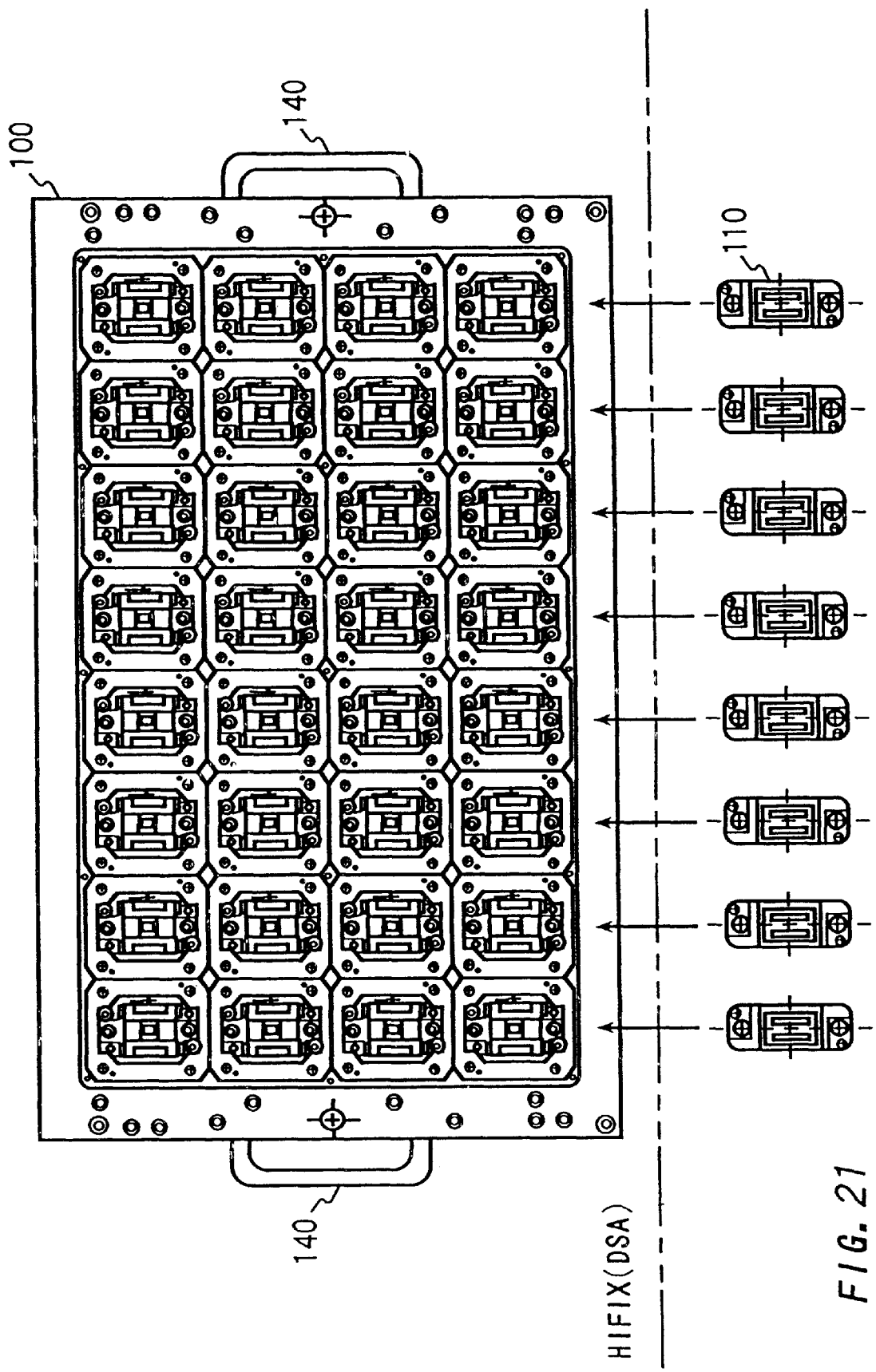
FIG. 21 is a top view of the frame 100.

FIG. 21 is a top view of the frame 100. Handles 140 for grabbing the frame 100 by human or robot hands are formed on both ends of the frame 100. Each of the holding units 110 can be displaced independently of the other holding units 110 within the frame 100. Conventionally, in order to securely bring each of the holding units 110 into contact with the socket 50, each of the holding units 110 was installed on the socket 50 first. After this, the holding unit was fixed from above. According to the present embodiment, each of the holding units 110 is displaced to the suitable position when the frame 100 is mounted on the semiconductor testing apparatus. Therefore, many test boards 10 or semiconductor devices 20 can be easily mounted or removed.

In particular, by preparing multiple frames 100 on which a required test board 10 is pre-installed and a frame 100 on which a semiconductor device 20 is pre-installed, it becomes possible to change the type of the multiple test boards 10 or replace the test boards 10 with the semiconductor devices 20 simply by replacing the frame 100.

In the above-described embodiment, the test board 10 was mounted in place of the semiconductor device 20 to calibrate the semiconductor testing apparatus. According to the above-described embodiment, the signal line that is used to actually test the semiconductor device 20 is almost equal to the signal line that is used to calibrate the semiconductor testing apparatus. Therefore, the line impedance values in both cases become approximately equal to each other. Hence, the semiconductor testing apparatus can be calibrated in a state that is very close to the actual usage. However, as another embodiment, for example, the semiconductor device 20 and the socket 50 may be removed from the semiconductor testing apparatus and the test board 10 may be directly installed on the socket board 60. In this case, the line impedance in the state of the actual usage differs slightly from the line impedance in the state of calibration. However, since the area of the socket board 60 is larger than that of the top side of socket 50, the probe 44 can be easily brought into contact with the signal line.

Figure 22:
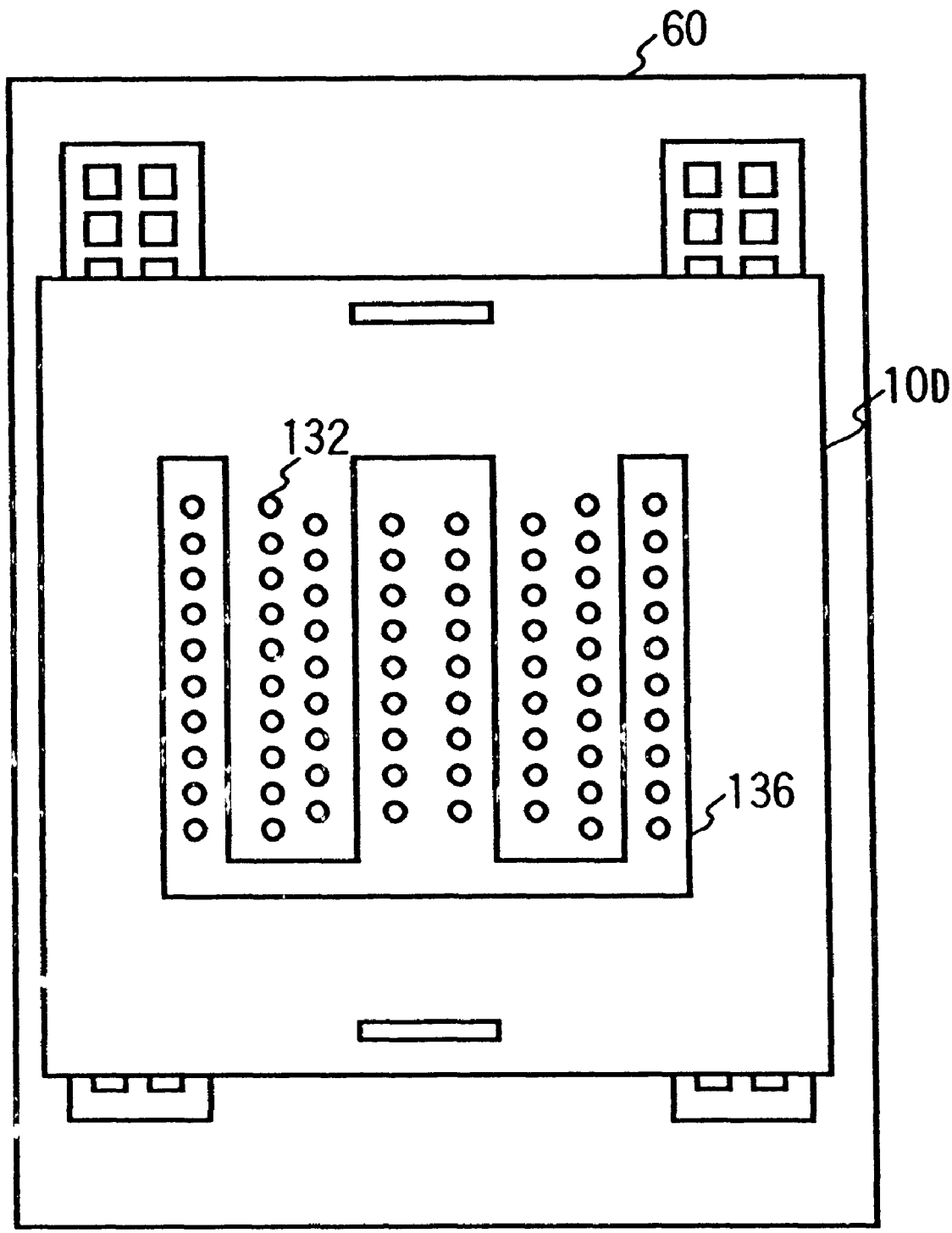
FIG. 22 is a top view of the socket board 60 on which a probe board 10D is installed.

FIG. 22 is a top view of the socket board 60 on which a probe board 10D is installed. Signal wire patterns 132 are arranged separated from each other by a prescribed distance on the top surface of the probe board 10D. Hence, when the signal terminal 40 of the probe 44 is brought into contact with the probe board 10D, it is possible to prevent the signal terminal 40 from getting short circuited with another signal wire pattern. Moreover, an earth pattern 136 is installed on the top surface of the probe board 10D. The earth pattern 136 is adjacent to each of the signal wire patterns 132. The shortest distance from the earth pattern 136 to each of the signal wire patterns 132 is less than 2 mm. Therefore, the signal terminal 40 of the probe 44 and the earth terminal 42 can be easily brought into contact with each of the signal wire patterns 132 and the earth pattern 136, respectively. Moreover, since the shortest distances from the earth pattern 136 to the signal wire patterns 132 are substantially equal to each other, the variance among the line impedance values of the signals is small. As a result, each of the signals can be measured accurately.

As an alternative, many such test boards 10 that can be installed in place of the semiconductor device 20 and the socket 50 may be prepared and each of the test boards 10 may be held by the holding unit 110 shown in FIG. 20. In actually testing the semiconductor, a socket 50 for the semiconductor device 20 is installed on the holding unit 110 and the frame 100 besides the semiconductor device 20. By preparing frames 100 on which necessary types of test boards are installed, the test boards 10 of one type can be switched with the test boards 10 of another type or the test board 10 can be replaced with the semiconductor device 20 simply by switching the frames 100.

It should be noted that in the above-described calibration, various types of terminals need to be brought into contact. In this case, this procedure may be carried out using a robot in place of human hands. As a result, a uniform pressure can be applied and the productivity is improved. Moreover, in the present embodiment, the test signal was detected using an oscilloscope. However, the test signal may be detected using, for example, a standard driver and a standard comparator or the like.

Thus, according to the present embodiment, the semiconductor testing apparatus calibration accuracy can be improved. Moreover, since multiple semiconductor devices can be easily installed on the testing apparatus, the efficiency of the semiconductor tests can be improved.

Figure 23:
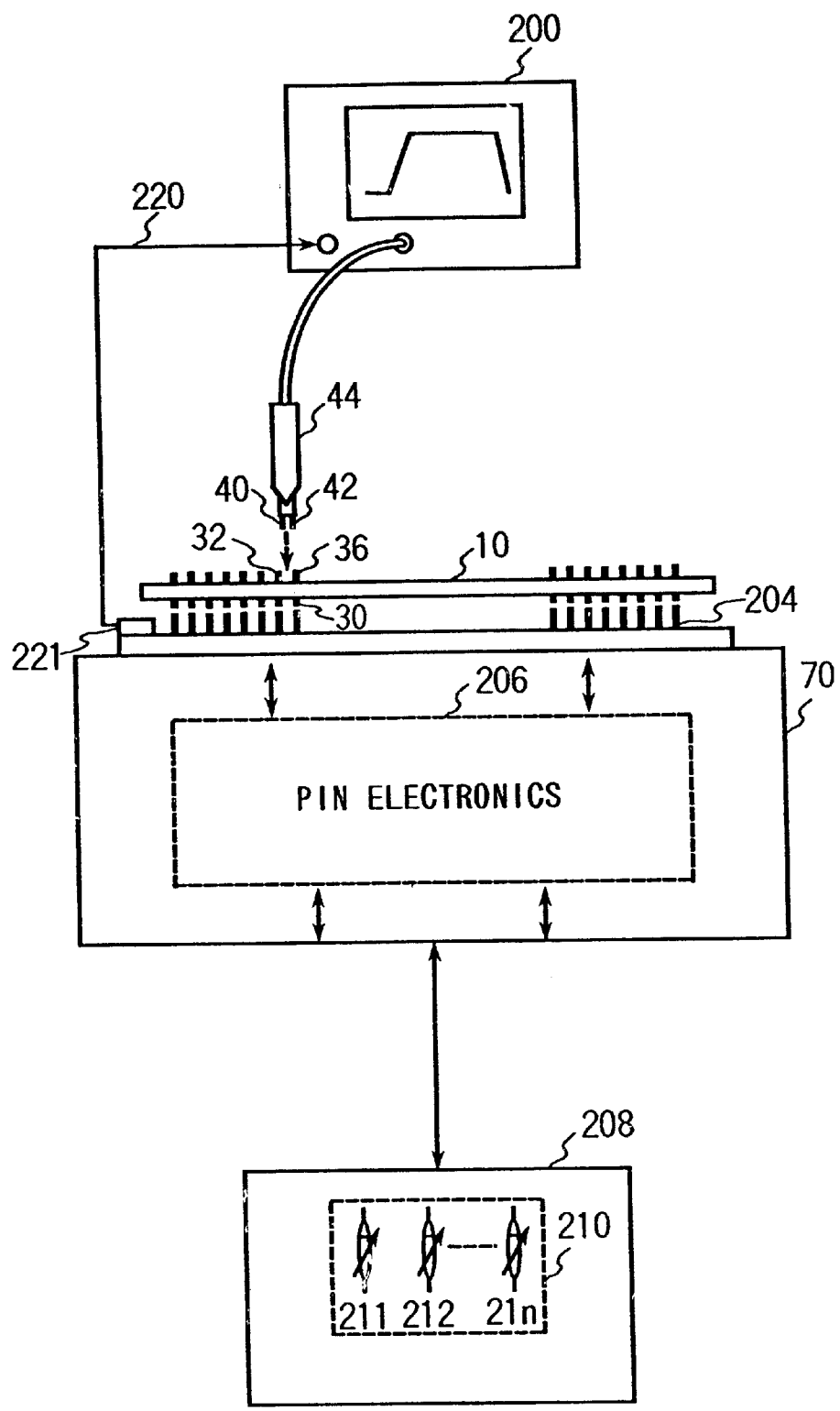
FIG. 23 shows another embodiment of the test board 10.

FIG. 23 shows another embodiment of the test board 10. In FIG. 23, those components that are already used in FIG. 10 will not be explained here. The test board 10 is installed on the test head 70 so as to contact the POGO pins 204 installed on the test head 70. The contact terminals 30 formed on the bottom surface of the test board 10 are arranged so as to match the arrangement of the POGO pins 204 of the test head 70. The signal wire pattern 32 and the earth pattern 36 formed on the top surface of the test board 10 are arranged so as to match the arrangement of the signal terminal 40 of the probe 44 and the earth terminal 42, respectively. The signal wire pattern 32 of the test board 10 and the earth pattern 36 are electrically connected to the contact terminals 30. Thus, by matching the arrangement of the contact terminals 30 of the test board 10 with the arrangement of the socket board 60, performance board 66, or the terminals of the test head 70, the test board 10 is mounted not only on the socket 50 but also on the socket board 60 or performance board 66 or test head 70.

The test head 70 receives an instruction from the testing apparatus main body 208, generates a test signal of a prescribed level, and supplies the test signal to the test board 10 via the POGO pins 204. The test head 70 contains an embedded pin electronics 206. The pin electronics 206 has multiple drivers 76, a driver delay circuit 78, a comparator 80, and a comparator delay circuit 82 not shown in the drawing. The oscilloscope 200 is a pre-calibrated measuring apparatus. The oscilloscope 200 is connected to the testing apparatus main body 208 via a communication means such as a GPIB or the like that can be controlled from both directions. Hence, a measurement can be carried out under desired conditions. The timing data of the measurement result is used as calibration data or judging process in the testing apparatus main body 208. The testing apparatus main body 208 has a main body delay circuit 210, and hence is capable of adjusting the setting value of the delay times for the comparator delay circuit 82 and the driver delay circuit 78 of the pin electronics 206, respectively.

The reference pulse signal 220 is supplied from the reference signal terminal 221 installed in the test head 70 to the trigger input terminal of the oscilloscope 200. Based on the reference pulse signal 220, the driver 76 adjusts the timing for outputting the test signal. The signal terminal 40 of the probe 44 connected to the oscilloscope 200 and the earth terminal 42 are contacted by the signal wire pattern 32 of the test board 10 and the earth pattern 36, respectively. As a result, the signal terminal 40 and the earth terminal 42 are electrically connected to the signal wire pattern 32 of the test board 10 and the earth pattern 36, respectively.

Figure 24:
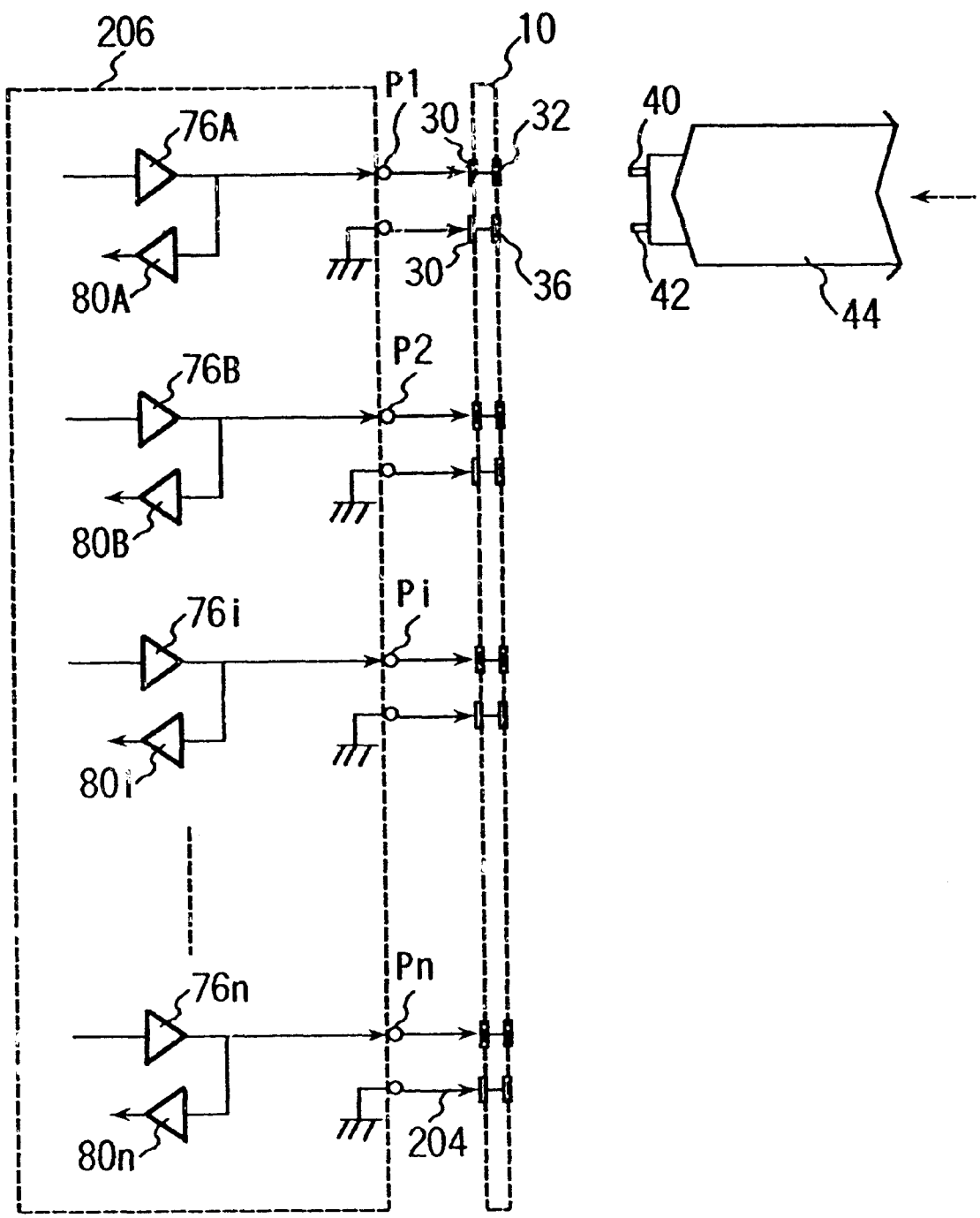
FIG. 24 is a connection diagram of the semiconductor testing apparatus shown in FIG. 23.

FIG. 24 is a connection diagram of the semiconductor testing apparatus shown in FIG. 23. The test board 10 is electrically connected to the pin electronics 206. The contact terminal 30 of the test board 10 is in contact with the POGO pins 204 installed at the output terminal P1 of the pin electronics 206. The test board 10 is calibrated so that the timings at which the multiple drivers 76 output the test signals at the signal wire patterns 32 will become equal to each other.

Figure 25:
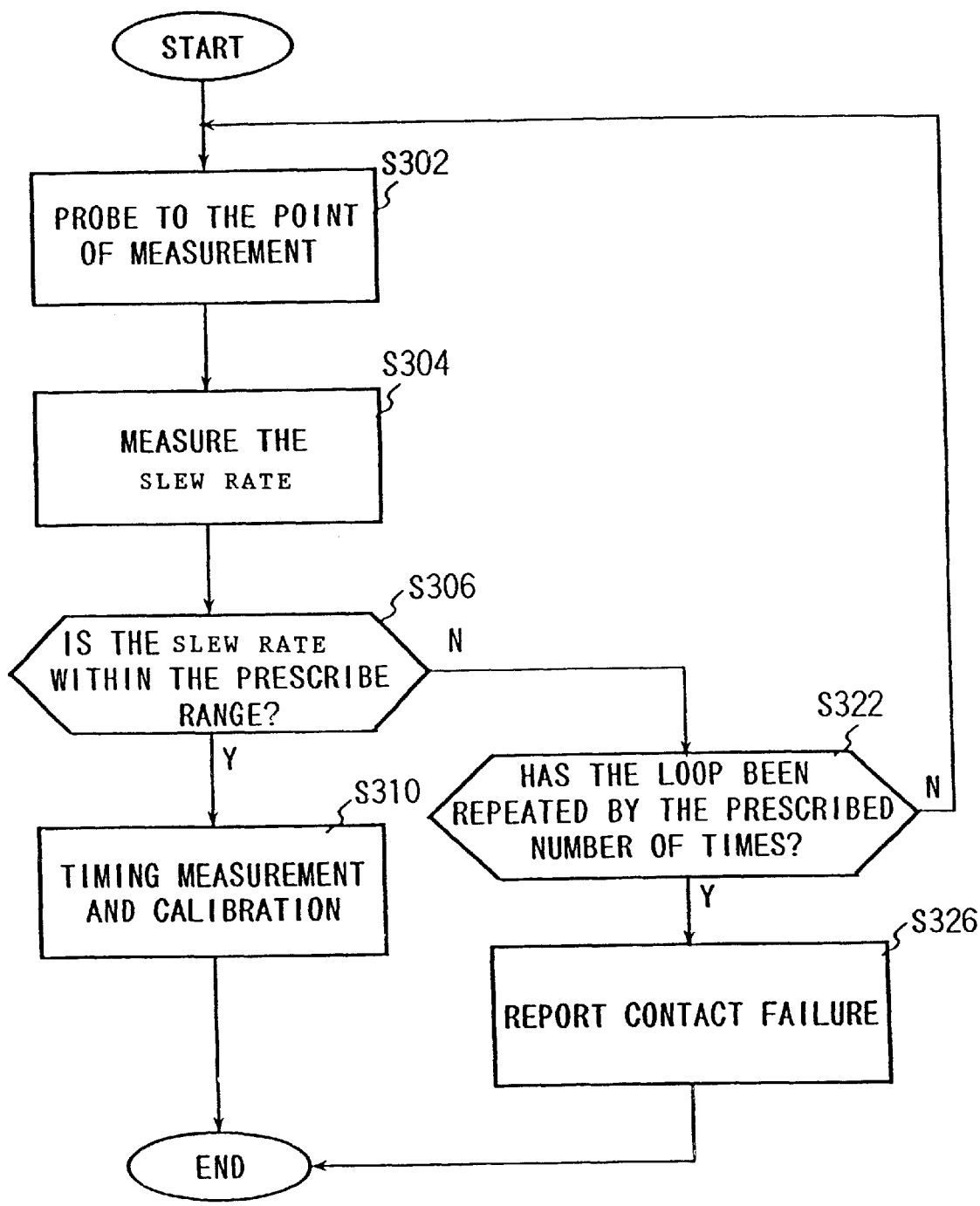
FIG. 25 is a flow chart showing the semiconductor testing apparatus calibration method shown in FIG. 23 or 24.

FIG. 25 is a flow chart showing the semiconductor testing apparatus calibration method shown in FIG. 23 or 24. It should be noted here that the range of technical applications of the semiconductor testing apparatus calibration method shown in this flow chart is not limited to the semiconductor testing apparatus shown in FIG. 23 or 24. This semiconductor testing apparatus calibration method is applicable to any semiconductor testing apparatus that measures a signal obtained from an object of measurement using an external measurement apparatus by having the probe 44 contact the object of measurement. In the conventional calibration method, there is a possibility that a contact failure with the object of measurement cannot be detected. Hence, in the present embodiment, the state of contact between the probe 44 and the object of measurement is checked before calibrating the driver 76.

First, the signal terminal 40 of the probe 44 and the earth terminal 42 are made to contact the signal wire pattern 32 and earth pattern 36 of the test board 10 (S302). Next, while the probe 44 is in contact with the test board 10, the slew rate, which is the length of time the wave form of the test signal output from the driver 76 requires to rise or fall, is measured by the oscilloscope 200 (S304). Here, the state of contact between the probe 44 and the test board 10 is judged using either the rise or fall of the wave form. Next, it is judged whether the measured slew rate is within the desired range of slew rate and the step then branches out (S306).

If the slew rate is judged to lie outside the prescribed range in the slew rate judging S306, the probing S302, the slew rate measuring S304, and the slew rate judging S306 are repeated by a prescribed number of times. Furthermore, it is judged whether the probing S302, the slew rate measuring S304, and the slew rate judging S306 have been repeated by the prescribed number of times (S322). If the slew rate remains outside the prescribed range after the probing S302, the slew rate measuring S304, and the slew rate judging S306 have been repeated by the prescribed number of times, it is determined that the probe 44 is not in contact with the test board 10. The contact failure is then reported outside the semiconductor testing apparatus (S326). The operator of the test then examines the portion of contact failure on the transmission line between the driver 76 and the test board 10, and removes dust.

Figure 26:
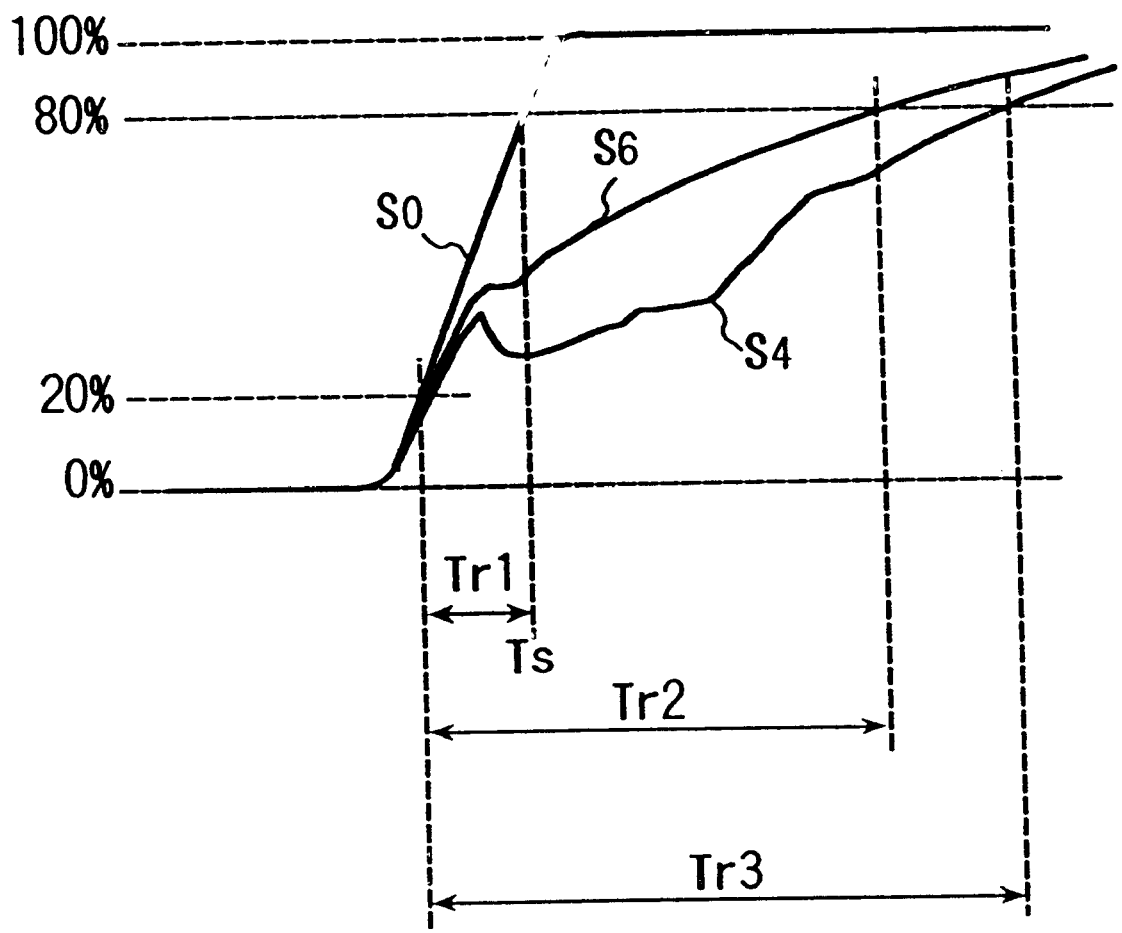
FIG. 26 shows the wave form measured in the slew rate measuring (S304).

FIG. 26 shows the wave forms of three types of probing in the case of the rise of the wave form measured in the slew rate measuring (S304). The first wave form S0 corresponds to the state of satisfactory contact. The second wave form S4 corresponds to the case in which the earth terminal 42 of the probe 44 and the earth pattern 36 of the test board 10 are open. The third wave form S6 corresponds to the case in which there is a high resistance of about several hundred W between the earth terminal 42 and the earth pattern 36. The slew rate is calculated as follows. The 20% level and the 80% level are set as two threshold values. The time at which the level of the wave form reaches the 20% level is subtracted from the time at which the level of the wave form reaches the 80% level to obtain the slew rate.

The slew rate Tr1 of the first wave form S0 agrees approximately with the normal slew rate. In this case, it is easily judged that the contact state is satisfactory. The slew rate Tr3 of the second wave form S4 is several times higher than the slew rate Tr1 that is approximately equal to the normal slew rate. In this case, it can be judged that the contact state between the earth terminal 42 and the earth pattern 36 is unsatisfactory. The slew rate Tr2 of the third wave form S6 is also several times higher than the slew rate Tr1 that is approximately equal to the normal slew rate. In this case also, it can be judged that the contact state between the earth terminal 42 and the earth pattern 36 is unsatisfactory.

As further another embodiment, instead of measuring the slew rate, the contact state between the earth terminal 42 and the earth pattern 36 may be judged in the following manner. First, a desired threshold range is set based on a normal signal level at a specific time within the interval of the rise or fall of the test signal. It is then judged whether the level of the measured signal lies within the desired threshold range or not. For example, when the timing at which the wave form level is measured is Ts and the threshold range is set over 80% of the level of the normal signal, the level of the wave form S0 lies in the threshold range. However, in this case, the wave forms S4 and S6 lie outside the threshold range. Hence, it is judged that the contact state indicated by the wave form S0 is satisfactory, and the contact states indicated by the wave forms S4 and S6 are unsatisfactory.

Figure 27A:
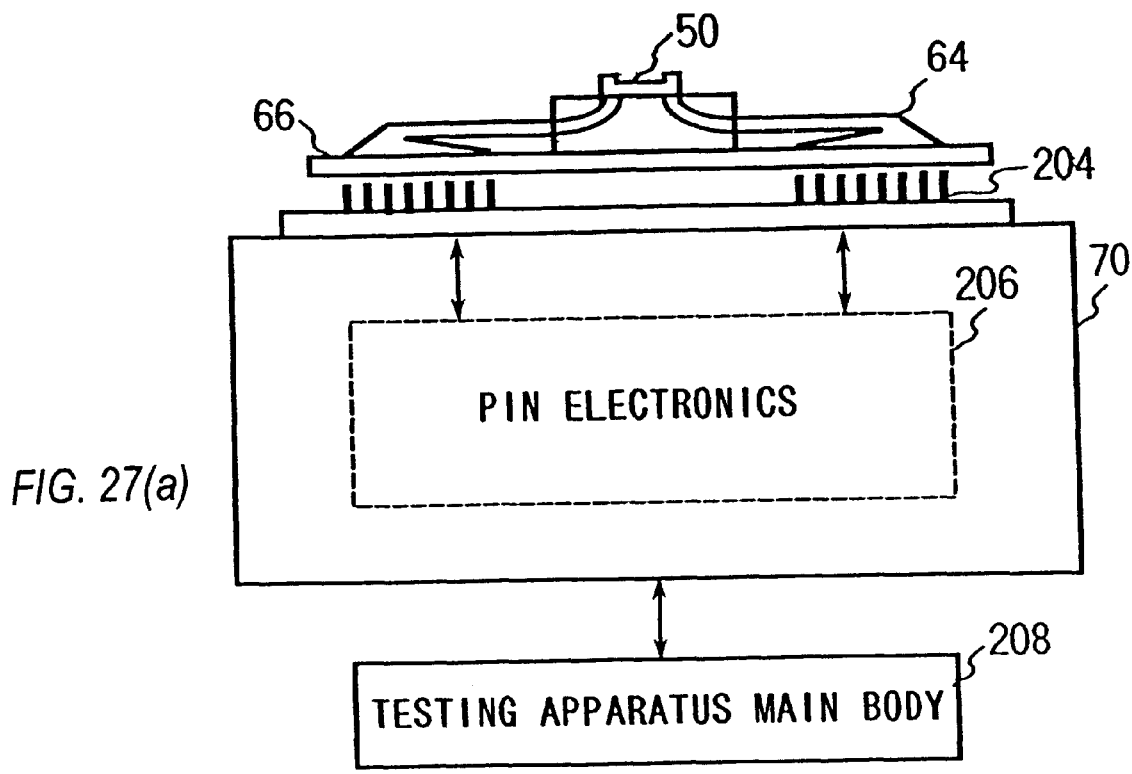
FIG. 27(a) is a schematic drawing of the semiconductor testing apparatus showing further another calibration method.
Figure 27B:
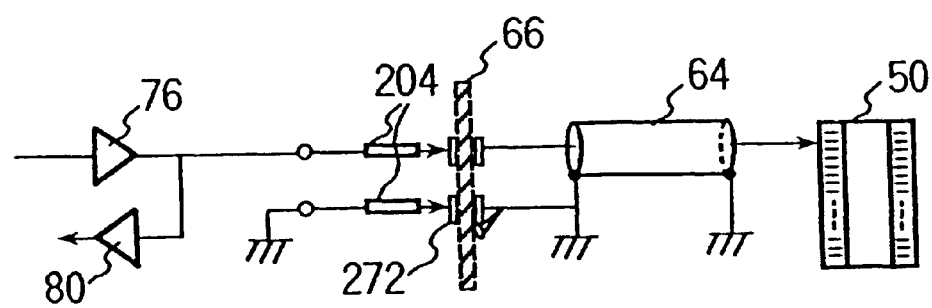
FIG. 27(b) is a connection diagram of the semiconductor testing apparatus showing further another calibration method.

FIG. 27(a) is a schematic drawing of the semiconductor testing apparatus showing further another calibration method. FIG. 27(b) is a connection diagram of the semiconductor testing apparatus showing further another calibration method. In FIGS. 27(a) and (b), the same reference numerals are given to those components that have already been used in FIGS. 23 and 24. Such components will not be explained here. The performance board 66 is installed so as to contact the POGO pins 204 and is electrically connected to the POGO pins 204. The socket 50 on which the semiconductor device 20 or test board 10 is mounted is connected to the performance board 66 via the coaxial cable 64. The socket 50 supplies test signals generated by the drivers 76 inside the pin electronics 206 to the semiconductor device 20 or test board 10 via the coaxial cable 64. In the semiconductor testing apparatus shown in FIG. 27, there is a possibility that a contact failure will occur at the contact spot 272 between the POGO pin 204 and the performance board 66.

Figure 28:
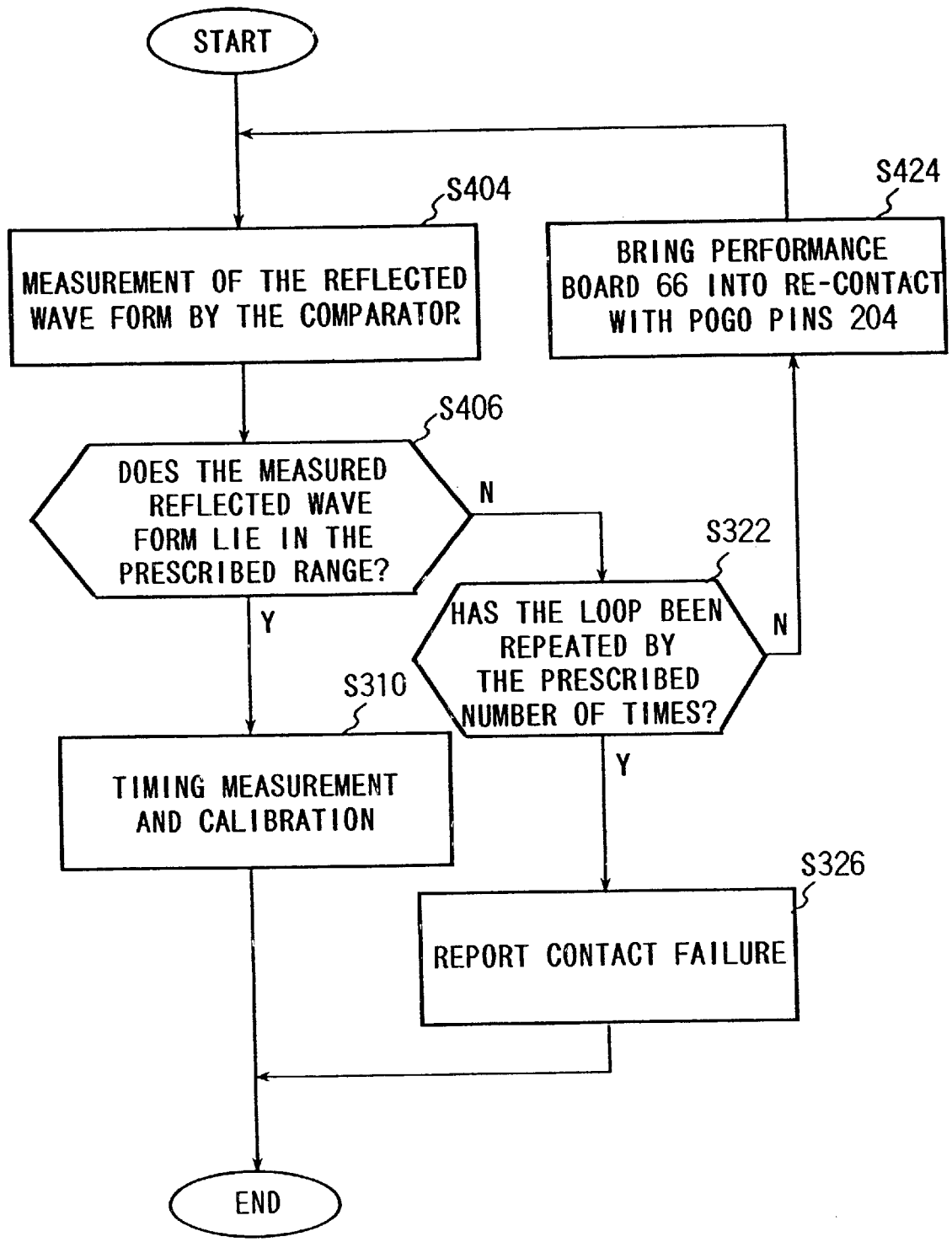
FIG. 28 is a flow chart showing the embodiment of the calibration of the semiconductor testing apparatus shown in FIG. 27.

FIG. 28 is a flow chart showing the embodiment of the calibration of the semiconductor testing apparatus shown in FIG. 27. First, using the comparator 80 connected to the driver 76, the reflect ion wave form that has been output from the driver 76 and reflected by the socket 50 is input to the testing apparatus main body 208. The input wave form is then measured in the testing apparatus main body 208 (S404). Next, it is judged in the testing apparatus main body 208 whether the measured reflected wave form lies in the prescribed range or not (S406). If the measured reflected wave form does not lie in the desired range, the process branches out to the step for judging the number of loop s (S322).

If it is judged that the measured reflected wave form lies outside the prescribed range, the performance board 66 is brought into re-contact with the POGO pins 204 (S424). The reflected wave form measuring S404 and the reflected wave form judging S406 are then repeated. Next, it is judged whether the re-contact S424, the reflected wave form measuring S404, and the reflected wave form judging S406 have been repeated by the prescribed number of times (S322). If it has been judged that the measured wave form still lies outside the prescribed range after the re-contact S424, the reflected wave form measuring S404, and the reflected wave form judging S406 have been repeated by the prescribed number of times, the contact between the performance board 66 and the POGO pins 204 is judged to be a failure. In this case, the contact failure is reported outside the semiconductor testing apparatus. (S326).

Figure 29A:
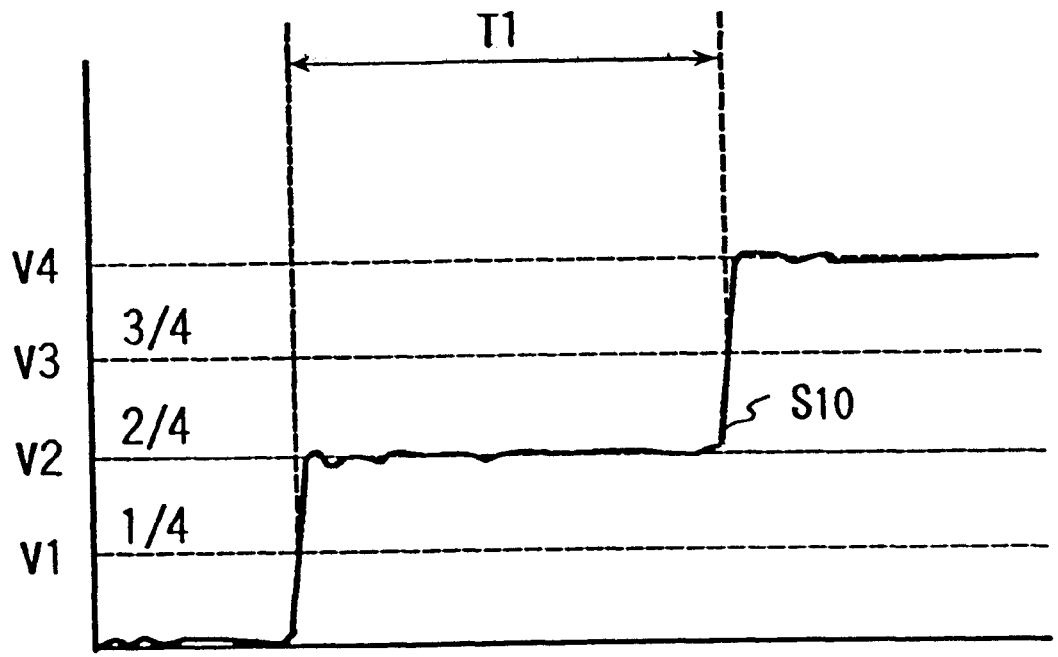
FIG. 29 shows an exemplary reflected wave form measured in the reflected wave form measuring S404.
Figure 29B:
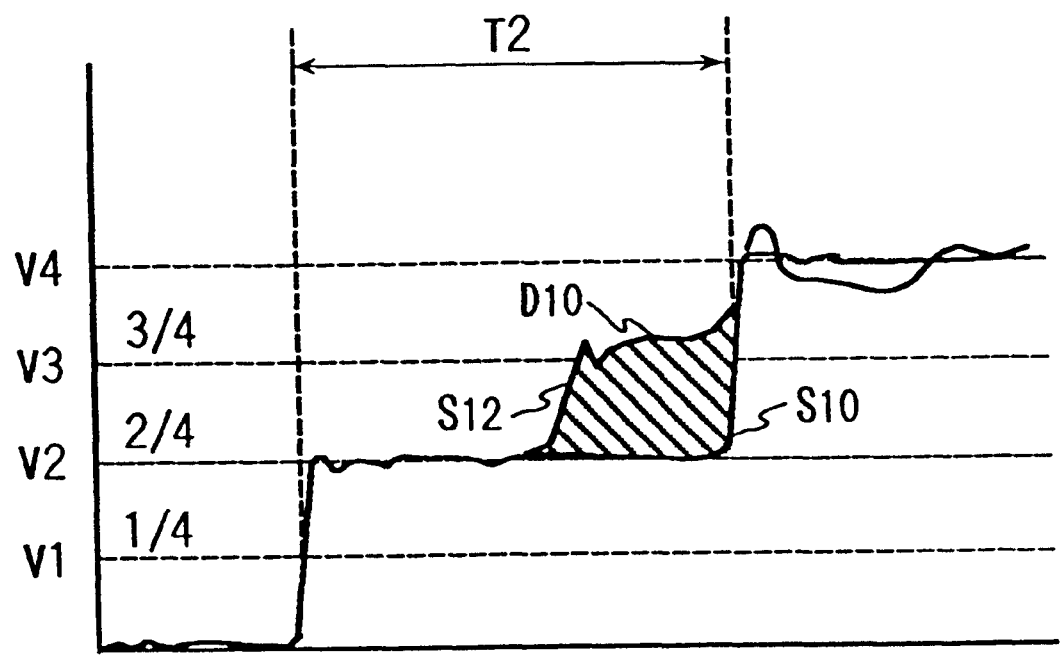

FIG. 29 shows an exemplary reflected wave form measured in the reflected wave form measuring S404. The transitional wave form $S_{10}$ shown in FIG. 29(b) is measured in the reflected wave form measuring S404. The transitional wave form $S_{10}$ occurs in the normal case. The transition of the reflected wave form is determined by the output of the driver 76 and the length of the transmission line. That is, as shown in FIG. 29(a), the transitional wave form $S_{10}$ in the normal case first transits at the level V2 that is half the height of the level V4, and reaches the level V4 after time T1 that is the length of time the pulse requires to go back and forth through the transmission line. The transitional wave form $S_{10}$ is used as a reference for comparing the measured transitional wave form $S_{12}$ with the transitional wave form $S_{10}$. In the reflected wave form judging S406, the difference between the data of the measured transitional wave form $S_{12}$ and the transitional wave form $S_{10}$ as a reference is calculated. It is judged whether the measured wave form is admissible or not based on the distribution state $D_{10}$ that is the amount of the calculated difference.

The calibration method shown in FIGS. 28 and 29 is applicable to the calibration method shown in FIGS. 17, 18, and 19 in which the reflected signals are generated using the earth short board 100. Moreover, the calibration method shown in FIGS. 28 and 29 is applicable to the case in which the test board 10 shown in FIG. 23 is mounted on a position other than the socket 50 also, since the reflected signal can be generated by using the earth short board 10C as the test board 10.

Figure 30:
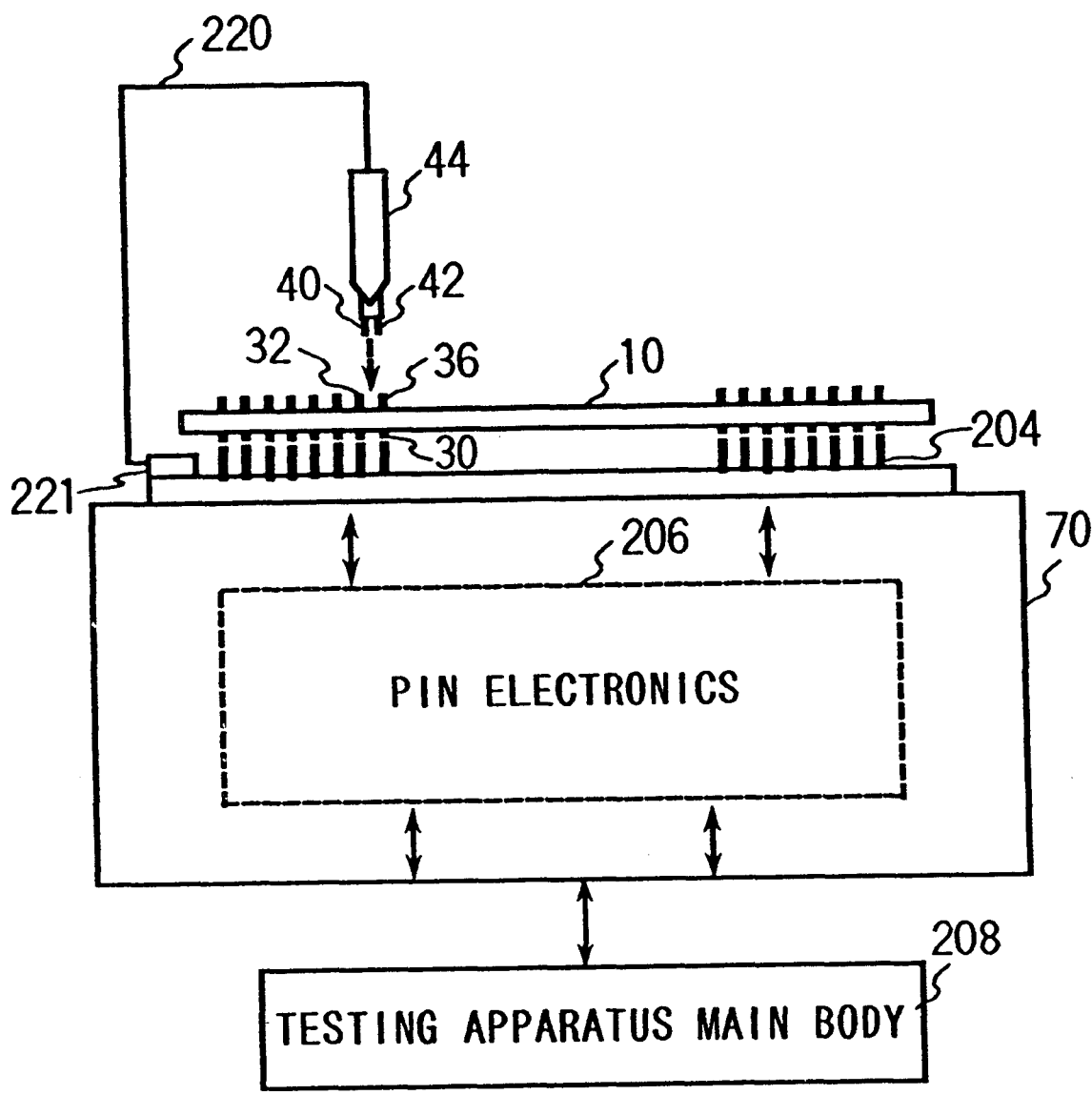
FIG. 30 shows another embodiment of a calibration method of the comparator 80.

FIG. 30 shows another embodiment of a comparator 80 calibration method. The configuration of the semiconductor testing apparatus shown in FIG. 30 is identical to that shown in FIG. 23 except that the probe 44 is connected to the reference signal terminal 221 and the reference pulse signal 220 input from the reference signal terminal 221 is supplied to the test board 10 via the probe 44. By supplying the reference pulse signal 220 as a reference timing to the test board 10, the reference timing is input to multiple comparators 80. In this way, the comparators 80 are calibrated. The contact failure detection method described in FIGS. 25 and 26 is applicable to the comparator 80 calibration method. For example, when there is a contact failure between the probe 44 and the test board 10, a reference pulse signal 220 whose wave form is similar to the wave form S4 or S6 shown in FIG. 26 is input to the comparator 80. In this case also, as in the case of FIG. 26, for example, the 20% level and 80% level of the level of the wave form S0 are selected as the threshold levels. The time at which the level of the wave form reaches the 20% level is then subtracted from the time at which the level of the wave form reaches the 80% level to obtain the slew rate. The difference between this slew rate and the slew rate Tr1 in the normal state is then obtained. Hence, as in the case of the output timing calibration of the driver 76, the contact failure between the probe 44 and the test board 10 can be detected in the comparator 80 also.

As further another embodiment, as described with reference to FIG. 26, instead of measuring the slew rate, the contact state may be judged by the following method. First, a desired threshold range is set based on a normal signal level at a specific time within the interval of the rise or fall of the test signal. It is then judged whether the level of the measured signal lies within the desired threshold range or not.

So far, the present invention has been explained using preferred embodiments. However, the range of technical applications of the present invention is not limited to these embodiments. Other variations and modifications of the above-described embodiments should be evident to those skilled in the art. Accordingly, it is intended that such alterations and modifications be included within the scope and spirit of the present invention as defined by the following claims.

What is claimed is:

1. A calibration method for calibrating a semiconductor testing apparatus before mounting semiconductor devices for performing a testing of electric characteristics thereof, the testing apparatus having a driver which generates and outputs a signal, and a socket with a plurality of terminals for receiving pins and transferring the signals therethrough, the calibration method comprising:

mounting onto said socket a test board having a plurality of pins and connecting each of said pins of said test board with a respective terminal of said socket;

transferring the signal of the driver to said terminals of said test board;

detecting said signal of the driver that has reached said test board; and setting an output timing of said signal of the driver based on the detection of said signal.

2. A calibration method as claimed in claim 1, wherein a pin of said test board that contacts said first terminal has an input impedance that is substantially equal to an input impedance of a pin of said semiconductor device that contacts said first terminal.

3. A calibration method as claimed in claim 1, wherein a contact terminal of said test board that contacts said first terminal is connected to an earth pattern of said test board, and wherein said detecting includes measuring said test signal that has been output from said driver and reflected by said test board.

4. A calibration method as claimed in claim 1, wherein said mounting includes examining a contact failure between said socket and said test board by measuring a direct current resistance between said socket and said test board.

5. A calibration method as claimed in claim 1, wherein said semiconductor testing apparatus further has a comparator which receives said test signal which is returned from said test board, and wherein said mounting has:
measuring said test signal that has been output from said driver and reflected by said test board using said comparator;
judging whether a wave form of said test signal measured by said comparator lies within a prescribed range or not; and
reporting a contact failure on a transmission line between an output end of said driver and said test board when said wave form measured by said comparator lies outside said prescribed range.

6. A calibration method as claimed in claim 1, wherein said semiconductor testing apparatus further has a delay circuit which supplies a delay to said test signal, and wherein said generating includes outputting said test signal using said driver and generating a prescribed reference signal,
and wherein said setting has a delay setting for setting a size of said delay supplied to said test signal detected in said detecting by said delay circuit based on a phase difference with respect to said reference signal.

7. A calibration method as claimed in claim 6, wherein said test board has a signal wire pattern for contacting said first terminal and an earth pattern that is arranged adjacent to said signal wire pattern, and wherein said detecting includes detecting said test signal using an electric characteristic testing probe installed on said earth pattern and said signal wire pattern.

8. A calibration method as claimed in claim 7, wherein said mounting includes examining a contact failure by measuring a direct current resistance between said electric characteristic testing probe and said test board.

9. A calibration method as claimed in claim 7, wherein said mounting has checking a contact failure between said electric characteristic testing probe and said test board, said checking including:
contacting said electric characteristic test probe with said test board;
measuring in an external measuring apparatus said test signal detected by said electric characteristic test probe;
judging whether a wave form of said test signal measured by said external measuring apparatus lies within a prescribed range; and
reporting a contact failure between said electric characteristic test probe and said test board when said wave form measured by said external measuring apparatus lies outside said prescribed range.

10. A calibration method as claimed in claim 1, wherein said socket further has a second terminal which contacts said semiconductor device and receives an electric signal from said semiconductor device,
and wherein said semiconductor testing apparatus further has a comparator for receiving a signal input from said second terminal,
and wherein said test board is a short board including a short pattern which electrically connects said first terminal with said second terminal.

11. A calibration method as claimed in claim 10, wherein said detecting has;
detecting said test signal that has been output from said driver and passed through said short board by said comparator; and setting, as a reference time for testing said semiconductor device for said comparator, a value obtained based on a time difference between a reference timing having a prescribed time difference with respect to said generating and a time at which said test signal is detected in said detecting.

12. The method of claim 1, further comprising:
removing said test board from said socket after calibration.

13. The method of claim 12, further comprising:
mounting a semiconductor device onto said socket after removing said test board.

14. A calibration method for calibrating a processing timing of a semiconductor testing apparatus before mounting semiconductor devices for performing a testing of electric characteristics thereof, the testing apparatus having a socket including a first terminal capable of supplying a test signal to said semiconductor device when a semiconductor device is mounted on said semiconductor testing apparatus and a second terminal which receives an electric signal from said semiconductor device, a driver which outputs said test signal to said first terminal, and a comparator which receives a signal from said second terminal, the calibration method comprising:
mounting onto said socket a short board having a short pattern which electrically connects said first terminal with said second terminal;
outputting said test signal from said driver;
measuring in said comparator said test signal that has been output from said driver and passed through said short board; and
setting a value obtained based on a time difference between a reference timing having a prescribed time difference with respect to said outputting and a time at which said test signal is measured in said measuring as a reference time that is used to test said semiconductor device for said comparator.

15. A calibration method as claimed in claim 14, wherein said semiconductor testing apparatus has a plurality of said drivers and a plurality of said comparators, said socket has a plurality of said first terminals corresponding to said plurality of said drivers and a plurality of said second terminals corresponding to said plurality of said comparators, and said short board has a plurality of said short patterns which connect said plurality of said first terminals with said second terminals, respectively,
and wherein, in said setting, said reference time is set for each of said plurality of said comparators independently of each other.

16. A calibration method for calibrating a processing timing of a semiconductor testing apparatus before mounting semiconductor devices for performing a testing of electric characteristics thereof, the testing apparatus having a driver which outputs a test signal for testing a semiconductor device, a comparator which receives an electric signal from said semiconductor device, a socket capable of supplying said test signal to said semiconductor device when said semiconductor device is mounted on said semiconductor testing apparatus, the calibration method comprising:
providing a desired connection to a measuring apparatus which measures a wave form of said test signal so as to supply said test signal or said electric signal;
measuring in said measuring apparatus said test signal output from said driver;
judging whether a wave form of said test signal measured by said measuring apparatus lies within a prescribed range or not; and reporting that a connection made to said measuring apparatus is a failure when said wave form measured by said measuring apparatus lies outside said prescribed range.

17. A calibration method as claimed in claim 16, wherein a rising wave form or falling wave form of said test signal is measured in said measuring.

18. A calibration method as claimed in claim 16, wherein said reporting has:
repeating said connecting, said wave form measuring, and said wave form judging when said wave form lies outside said prescribed range; and
reporting that said connection made to said measuring apparatus is a failure when said wave form lies outside said prescribed range after said providing, said measuring, and said judging have been repeated by a prescribed number of times.

19. A calibration method as claimed in claim 16, wherein said measuring apparatus is installed outside said semiconductor testing apparatus, and said measuring apparatus has an electric characteristic test probe for inputting said test signal,
and wherein said providing includes carrying out a necessary connection so as to supply said test signal to said an electric characteristic test probe.

20. A calibration method as claimed in claim 16, wherein said measuring apparatus is installed inside said semiconductor testing apparatus; and said measuring includes measuring in said measuring apparatus said test signal, which has been output from said driver, reflected by said socket, and input from said comparator.

21. A calibration method as claimed in claim 16, wherein said measuring apparatus is installed inside said semiconductor testing apparatus; and said measuring includes measuring in said measuring apparatus a prescribed reference signal that has been input from said comparator.

22. A calibration method as claimed in any of claims 16 through 19, wherein said providing includes connecting a test board, which inputs said test signal and provides said test signal to said measurement apparatus, with said measurement apparatus for said calibration.

23. A calibration method as claimed 22, wherein said measuring apparatus is installed inside said semiconductor testing apparatus; and
said measuring includes measuring in said measuring apparatus said test signal, which has been output from said driver, reflected by said test board, and input from said comparator.

24. The calibration method as claimed in claim 16, wherein said judging judges whether a level of said test signal during a rising or falling of said test signal lies within a prescribed range or not.

25. A semiconductor testing apparatus which is calibrated prior to performing a testing of electric characteristics of semiconductor devices, comprising:
a driver which generates and outputs a signal;
a socket operatively connecting to said driver and comprising a plurality of terminals at least one of which receives said output signal of said driver;
a test board having a plurality of pins each contacting a respective pin of said socket when said test board is mounted onto said socket for calibration, said pins corresponding to pins of said semiconductor devices, the semiconductor devices being mounted onto said socket for the testing thereof after calibration;
a detecting device connecting to said terminals for receiving signals therethrough; and
a setting unit operatively connecting to said driver for setting an output timing at which said driver outputs said signal to the semiconductor devices during the testing process on the basis of the output signal of said driver which reached said test board during calibration.

26. A semiconductor testing apparatus as claimed in claim 25, wherein said test board has a signal wire pattern for contacting said first terminal and an earth pattern that is arranged adjacent to said signal wire pattern.

27. A semiconductor testing apparatus as claimed in claim 25, wherein said test board has a signal wire pattern for contacting said first terminal and connecting said first terminal to earth, and said setting unit sets said output timing using said test signal that has been output from said driver and reflected by said test board.

28. A semiconductor testing apparatus as claimed in claim 25, wherein said test board has a test pin that contacts said first terminal and has an input impedance that is equal to an input impedance of a pin of said semiconductor device.

29. A semiconductor testing apparatus as claimed in claim 25, wherein said semiconductor testing apparatus further has;
a delay circuit which supplies a desired delay to said test signal; and
said setting unit has a generating unit for outputting said test signal and generating a prescribed reference signal, and said setting unit sets said output timing by setting a size of a delay supplied by said delay circuit.

30. A semiconductor testing apparatus as claimed in claim 26, wherein said semiconductor testing apparatus further has;
a plurality of said drivers and a plurality of delay circuits corresponding to said plurality of said divers;
said socket having a plurality of said first-terminals corresponding to each of said plurality of said drivers; and
said test board having a plurality of signal wire patterns corresponding to each of said plurality of said first terminals.

31. A semiconductor testing apparatus as claimed in claim 30, wherein shortest distances between said plurality of said signal wire patterns and said earth pattern are substantially same.

32. A semiconductor testing apparatus as claimed in claim 25, wherein said socket further has a second terminal which contacts said semiconductor device and receives an electric signal from said semiconductor device, and wherein said semiconductor testing apparatus further has a short board including a short pattern which electrically connects said first terminal with said second terminal and a comparator for measuring said test signal that has been output from said driver and passed through said short board.

33. A semiconductor testing apparatus as claimed in claim 32, wherein said semiconductor testing apparatus further has a reference time setting unit for setting, as a reference time that is used to test said semiconductor device for said comparator, a value obtained based on a time from a reference timing having a prescribed time difference with respect to said test signal output to a time at which said test signal is measured in said comparator.

34. A semiconductor testing apparatus as claimed in claim 33, wherein said semiconductor testing apparatus has a plurality of said drivers and a plurality of said comparators, said socket has a plurality of said first terminals corresponding to said plurality of said drivers and a plurality-of said second terminals corresponding to said plurality of said comparators, and said short board has a plurality of said short patterns which connect said plurality of said first terminals with said second terminals, respectively, and wherein, in said reference time setting unit, said reference time is set for each of said plurality of said comparators independently of each other.

35. A semiconductor testing apparatus as claimed in claim 25, wherein said semiconductor testing apparatus further comprising:

a plurality of said sockets;

a plurality of said test boards corresponding to each of a plurality of said sockets;

a frame which holds a plurality of said test boards; and said frame having a take-in structure to shift said test boards to desired positions when mounting said frame on prescribed position on said semiconductor testing apparatus.

36. The semiconductor testing apparatus of claim 25, further comprising:

a test board having on a first side a plurality of first pins each contacting a respective pin of said socket; and on a second side a plurality of second pins each electrically connecting to a respective first pin on the first side, wherein the second pins are selectively configured on the second side for a particular application.

37. The semiconductor testing apparatus of claim 25, further comprising:

a test board having on a first side a plurality of first pins each contacting a respective pin of said socket; a plurality of ground pins each electrically connecting to a respective a part of first pin, and a plurality of signal pins each electrically connecting to a respective other part of first pin on the first side;

wherein each said ground pin is electrically connected with other ground pins and electrically disconnected from said signal pins for calibrating skews originated from a driver.

38. The semiconductor testing apparatus of claim 25, further comprising:

A test board having on a first side a plurality of first pins each contacting a respective pin of said socket; a plurality of ground pins each electrically connecting to a respective part of each respective first pin, and a plurality of signal pins each electrically connecting to a respective other part of each respective first pin on the first side;

wherein a part of said signal pins is electrically connected each other signal pin and the other part of said signal pins is electrically disconnected from each other signal pin for calibrating skews originated from a comparator.

39. The semiconductor testing apparatus of claim 25, further comprising:

A test board having on a first side a plurality of first pins each contacting a respective pin of said socket; a plurality of ground pins each electrically connecting to a respective a part of each respective first pin, and a plurality of signal pins each electrically connecting to a respective other part of each respective first pin on the first side;

wherein said signal pins are electrically connected to said ground pins for calibrating skews originated from a sequence of components between a performance board and a socket.

40. A semiconductor testing apparatus for testing an electric characteristic of a semiconductor device, comprising:

a socket having a first terminal which contacts said semiconductor device and supplies an electric signal to said semiconductor device and a second terminal which contacts said semiconductor device and receives an electric signal from said semiconductor device;

a driver which outputs a test signal to said first terminal;

a short board which electrically connects said first terminal to said second terminal for calibration of said testing apparatus before mounting said semiconductor device;

a comparator which receives a signal input from said second terminal;

a detecting unit which detects in said comparator said test signal that has been output from said driver and passed through said short board; and a reference time setting unit for setting, as a reference time for testing said semiconductor device for said comparator, a value obtained based on a time difference between a reference timing having a prescribed time difference with respect to an output of said test signal output by said driver and a time at which said comparator has detected said test signal.

41. A semiconductor testing apparatus as claimed in claim 40, wherein said semiconductor testing apparatus has a plurality of said drivers and a plurality of said comparators, said socket has a plurality of said first terminals corresponding to said plurality of said drivers and a plurality of said second terminals corresponding to said plurality of said comparators, and said short board has a plurality of signal wire patterns which connect said plurality of said first terminals with said second terminals, respectively, and wherein, in said reference time setting unit, said reference time is set for each of said plurality of said comparators independently of each other.

42. A semiconductor testing apparatus as claimed in claim 40, wherein said semiconductor testing apparatus further comprising:

a plurality of said sockets;

a plurality of said short boards corresponding to each of a plurality of said sockets;

a frame which holds a plurality of said short boards; and said frame having a take-in structure to shift said short boards to desired positions when mounting said frame on prescribed position.

* * * * *